(12) United States Patent
Machida

(10) Patent No.: US 10,883,770 B2
(45) Date of Patent: Jan. 5, 2021

(54) LOOP TYPE HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 71 days.

(21) Appl. No.: 16/276,940

(22) Filed: Feb. 15, 2019

(65) Prior Publication Data

US 2019/0264988 A1  Aug. 29, 2019

(30) Foreign Application Priority Data

Feb. 27, 2018 (JP) ................. 2018-032871

(51) Int. Cl.
| | | |
|---|---|---|
| F28D 15/04 | (2006.01) | |
| F28F 3/08 | (2006.01) | |
| F28F 3/12 | (2006.01) | |
| F28D 15/02 | (2006.01) | |
| H01L 23/427 | (2006.01) | |
| H01L 21/48 | (2006.01) | |

(52) U.S. Cl.
CPC ....... *F28D 15/043* (2013.01); *F28D 15/0233* (2013.01); *F28F 3/08* (2013.01); *F28F 3/086* (2013.01); *F28F 3/12* (2013.01); *H01L 23/427* (2013.01); *H01L 21/4882* (2013.01)

(58) Field of Classification Search
CPC ............... F28D 15/043; F28D 15/0233; F28D 15/0266; F28F 3/086; F28F 3/12; F28F 3/08; F28F 1/00; F28F 21/089; H01L 23/427; H01L 21/4882; H05K 7/20336
See application file for complete search history.

(56) References Cited

U.S. PATENT DOCUMENTS 6,804,117 B2 * 10/2004 Phillips ............... F28D 15/0266
  361/700
9,151,545 B2 * 10/2015 Soukhojak .......... F28D 15/0266
(Continued)

FOREIGN PATENT DOCUMENTS

| EP | 2876678 A1 | 5/2015 |
| JP | 2002-327993 A | 11/2015 |
| WO | 2015/087451 | 6/2015 |

OTHER PUBLICATIONS

European Search Report dated Jul. 25, 2019, 7 pages.

*Primary Examiner* — Ljiljana V. Ciric
(74) *Attorney, Agent, or Firm* — Rankin, Hill & Clark LLP

(57) ABSTRACT

A loop type heat pipe includes: an evaporator configured to evaporate a working fluid; a condenser configured to condense the evaporated working fluid; a vapor pipe provided between the evaporator and the condenser; and a liquid pipe provided between the evaporator and the condenser. The vapor pipe includes: a lower-side metal layer; an intermediate metal layer disposed on the lower-side metal layer; an upper-side metal layer disposed on the intermediate metal layer; a pipe conduit formed by the lower-side metal layer, the intermediate metal layer and the upper-side metal layer; and a support column that is provided inside the pipe conduit, wherein the support column divides the pipe conduit into a first flow path and a second flow path. The pipe conduit has a first opening portion that communicates with the first flow path and the second flow path.

10 Claims, 28 Drawing Sheets

(56) References Cited

U.S. PATENT DOCUMENTS

| | | | |
|---|---|---|---|
| 10,408,546 B2* | 9/2019 | Kurashima | H01L 23/427 |
| 10,704,838 B2* | 7/2020 | Machida | F28D 15/0266 |
| 2012/0048516 A1 | 3/2012 | He et al. | |
| 2016/0259383 A1* | 9/2016 | Shioga | G06F 1/203 |

* cited by examiner

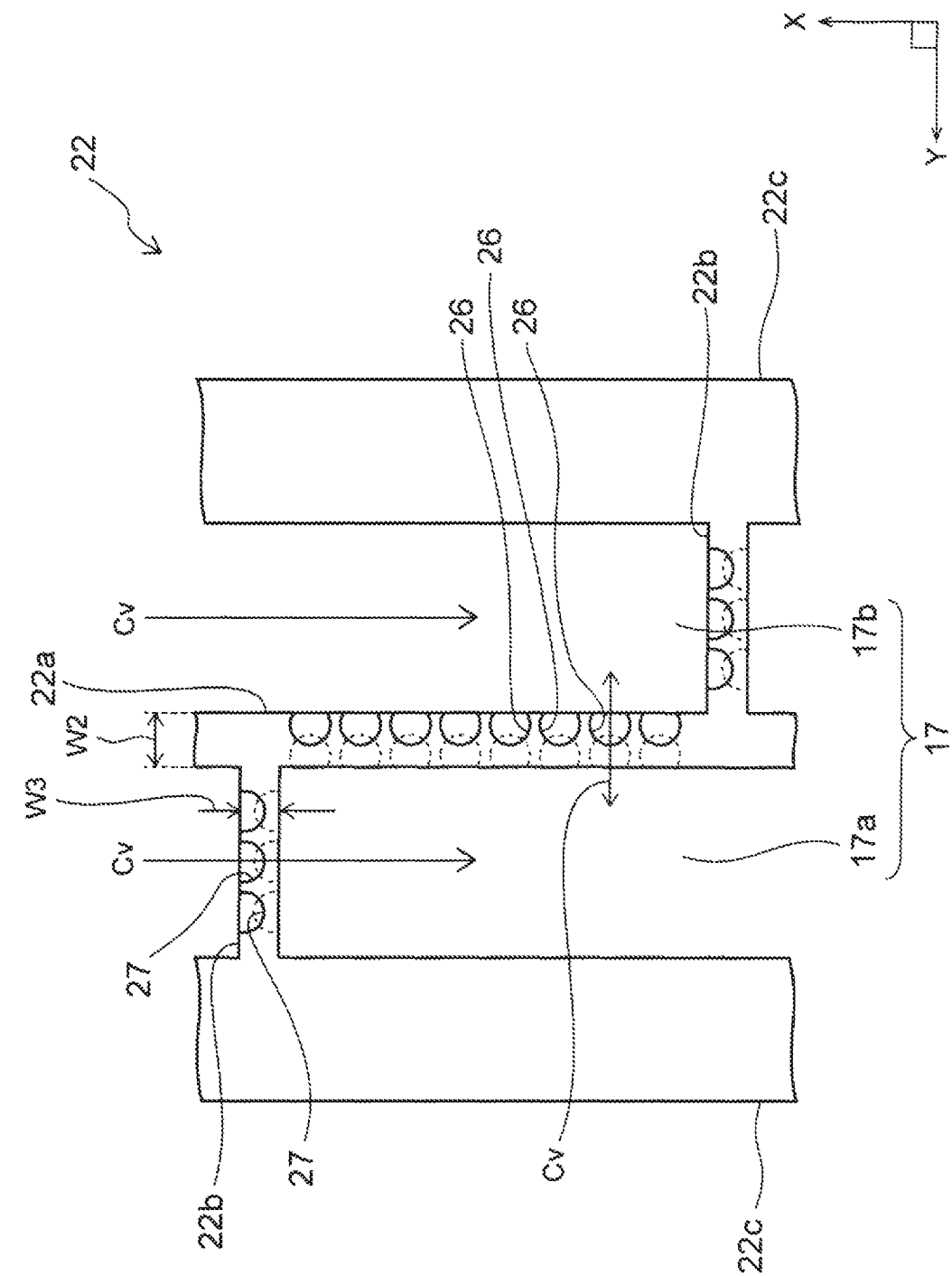

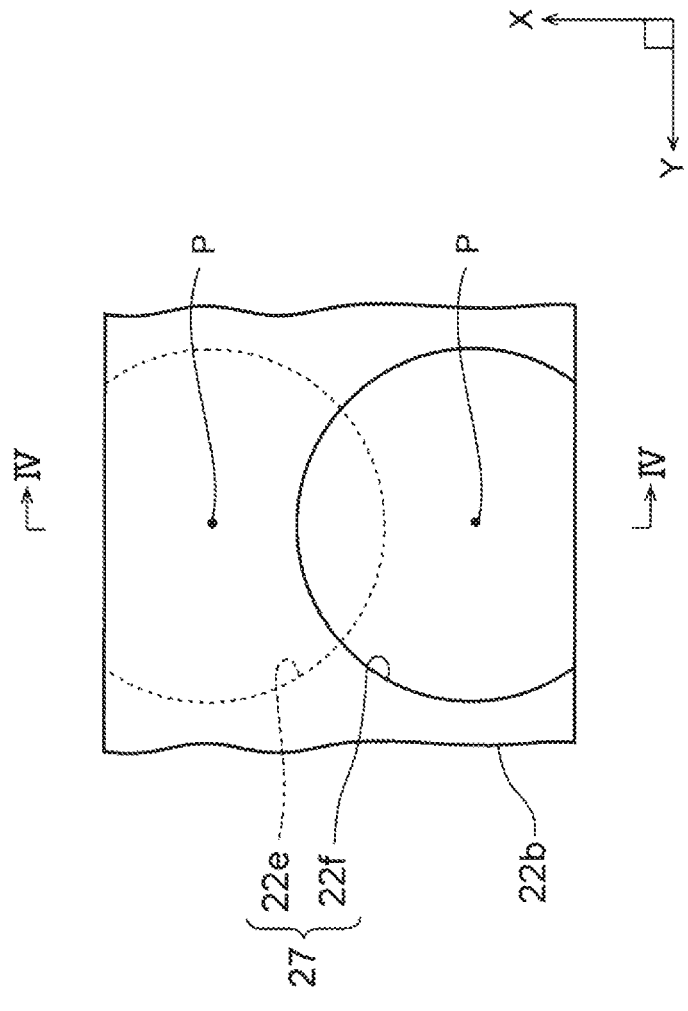
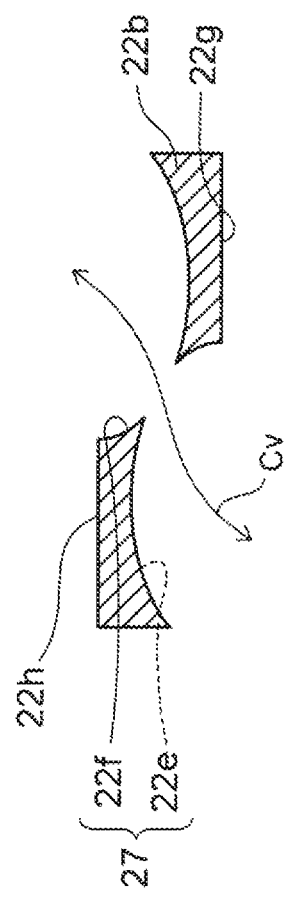
FIG.8A
FIG.8B

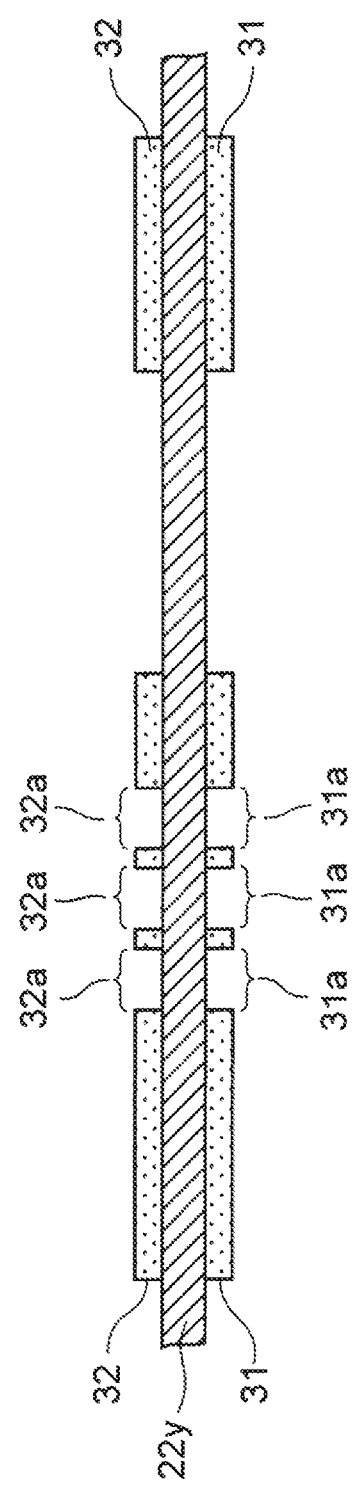
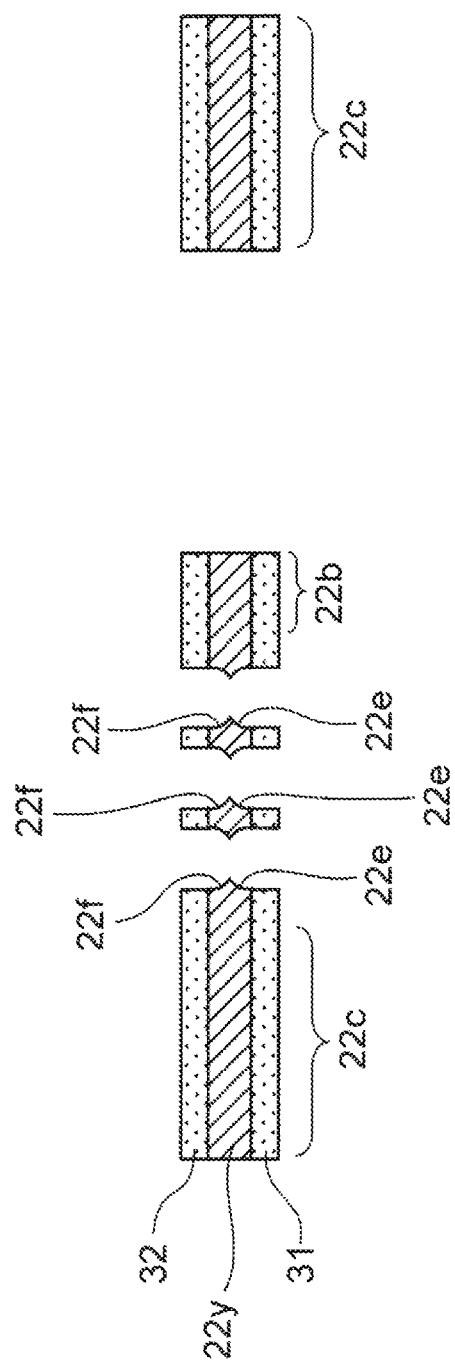
FIG.15A
FIG.15B

LOOP TYPE HEAT PIPE

This application claims priority from Japanese Patent Applications No. 2018-032871 filed on Feb. 27, 2018, the entire contents of which are herein incorporated by reference.

BACKGROUND

1. Technical Field

The present disclosure relates to a loop type heat pipe.

Background Art

There is a loop type heat pipe provided as a device for transporting heat generated by a mobile type electronic apparatus such as a smartphone. The loop type heat pipe is the device that uses phase change of a working fluid to perform the heat transport, and that has a loop-like pipe conduit in which the working fluid is enclosed.

There are several methods as to how to form the pipe conduit. Of them, a method in which thin metal plates are laminated to one another to thereby form the pipe conduit therein can be used to form the pipe conduit thin enough to suit the mobile type electronic apparatus, to thereby help on reduction of a thickness of the electronic apparatus.

When such a thin pipe conduit is crushed in the middle of manufacturing, pressure loss in the pipe conduit increases to thereby make the working fluid difficult to circulate in the loop type heat pipe. For this reason, a technique for providing a support column inside the pipe conduit has been studied in order to use the support column to prevent the pipe conduit from being crushed (see e.g., WO 2015/087451).

When the support column is provided thus inside the pipe conduit, vapor of the working fluid is difficult to circulate in the pipe conduit. Therefore, pressure loss in the pipe conduit increases to thereby lead to deterioration of heat transport ability of the loop type heat pipe.

SUMMARY

Certain embodiments provide a loop type heat pipe. The loop type heat pipe comprises: an evaporator that is configured to evaporate a working fluid; a condenser that is configured to condense the evaporated working fluid; a vapor pipe that is provided between the evaporator and the condenser, and through which the evaporated working fluid flows; and a liquid pipe that is provided between the evaporator and the condenser, and through which the liquid-phase working fluid flows. The vapor pipe comprises: a lower-side metal layer; an intermediate metal layer that is disposed on the lower-side metal layer; an upper-side metal layer that is disposed on the intermediate metal layer; a pipe conduit that is formed by the lower-side metal layer, the intermediate metal layer and the upper-side metal layer; and a support column that is provided inside the pipe conduit and is connected to the lower-side metal layer and the upper-side metal layer; wherein the support column divides the pipe conduit into a first flow path and a second flow path. The pipe conduit has a first opening portion that communicates with the first flow path and the second flow path.

BRIEF DESCRIPTION OF DRAWINGS

FIG. 6 is an enlarged plan view of an intermediate metal layer in the vapor pipe in the present embodiment;

FIG. 8A is an enlarged plan view of a second opening portion according to the present embodiment;

FIG. 8B is a sectional view taken along a line IV-IV of FIG. 8A;

FIGS. 15A and 15B are sectional views for explaining the manufacturing method of the intermediate metal layer according to the present embodiment (Part 1);

DETAILED DESCRIPTION

A matter that has been studied by the present inventor will be described prior to description of an embodiment of the present invention.

Figure 1:
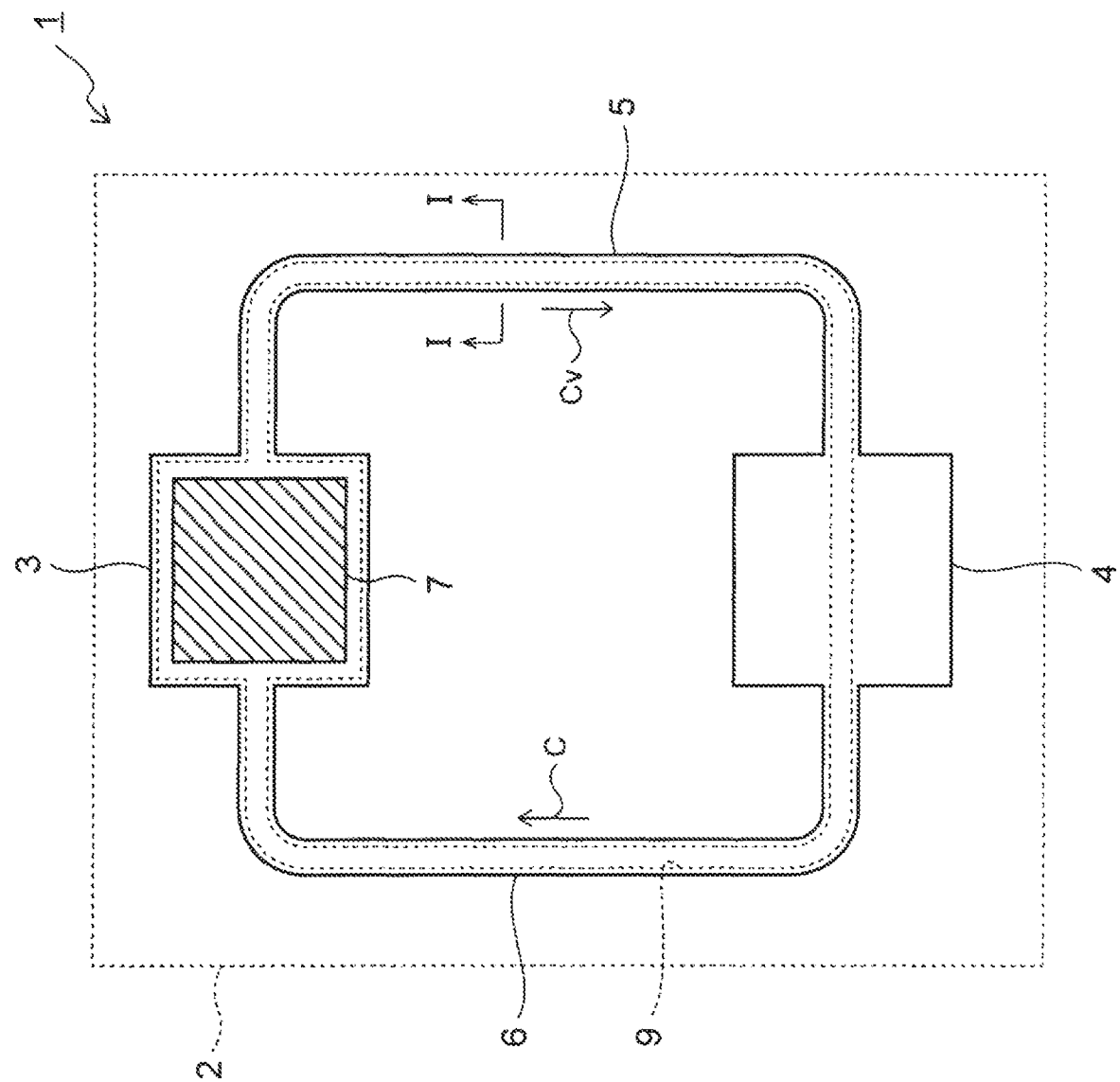
FIG. 1 is a top view of a loop type heat pipe that has been used for study.

FIG. 1 is a top view of a loop type heat pipe which has been used for the study.

The loop type heat pipe 1 is received in a housing 2 of a smartphone, a digital camera, or the like. The loop type heat pipe 1 is provided with an evaporator 3, a condenser 4, a vapor pipe 5 and a liquid pipe 6. The evaporator 3 is configured to evaporate a working fluid C. The condenser 4 is configured to condense the evaporated working fluid C. The vapor pipe 5 is provided between the evaporator 3 and the condenser 4, and the evaporated working fluid flows through the vapor pipe 5. The liquid pipe 6 is provided between the evaporator 3 and the condenser 4, and the liquid-phase working fluid C flows through the liquid pipe 6.

The vapor pipe 5 and the liquid pipe 6 are connected to the evaporator 3 and the condenser 4. Thus, a loop-like pipe conduit 9 through which the working fluid C flows is formed by the pipes 5 and 6. In addition, a heat generating component 7 such as a CPU (Central Processing Unit) is fixedly bonded to the evaporator 3. Vapor Cv of the working fluid C is generated by heat of the heat generating component 7.

After the vapor Cv is guided to the condenser 4 through the vapor pipe 5 to be liquefied in the condenser 4, the resulting working fluid C is supplied again to the evaporator 3 through the liquid pipe 6.

When the working fluid C circulates thus in the loop type heat pipe 1, the heat generated by the heat generating component 7 can move to the condenser 4 so that cooling of the heat generating component 7 can be accelerated.

Figure 2:
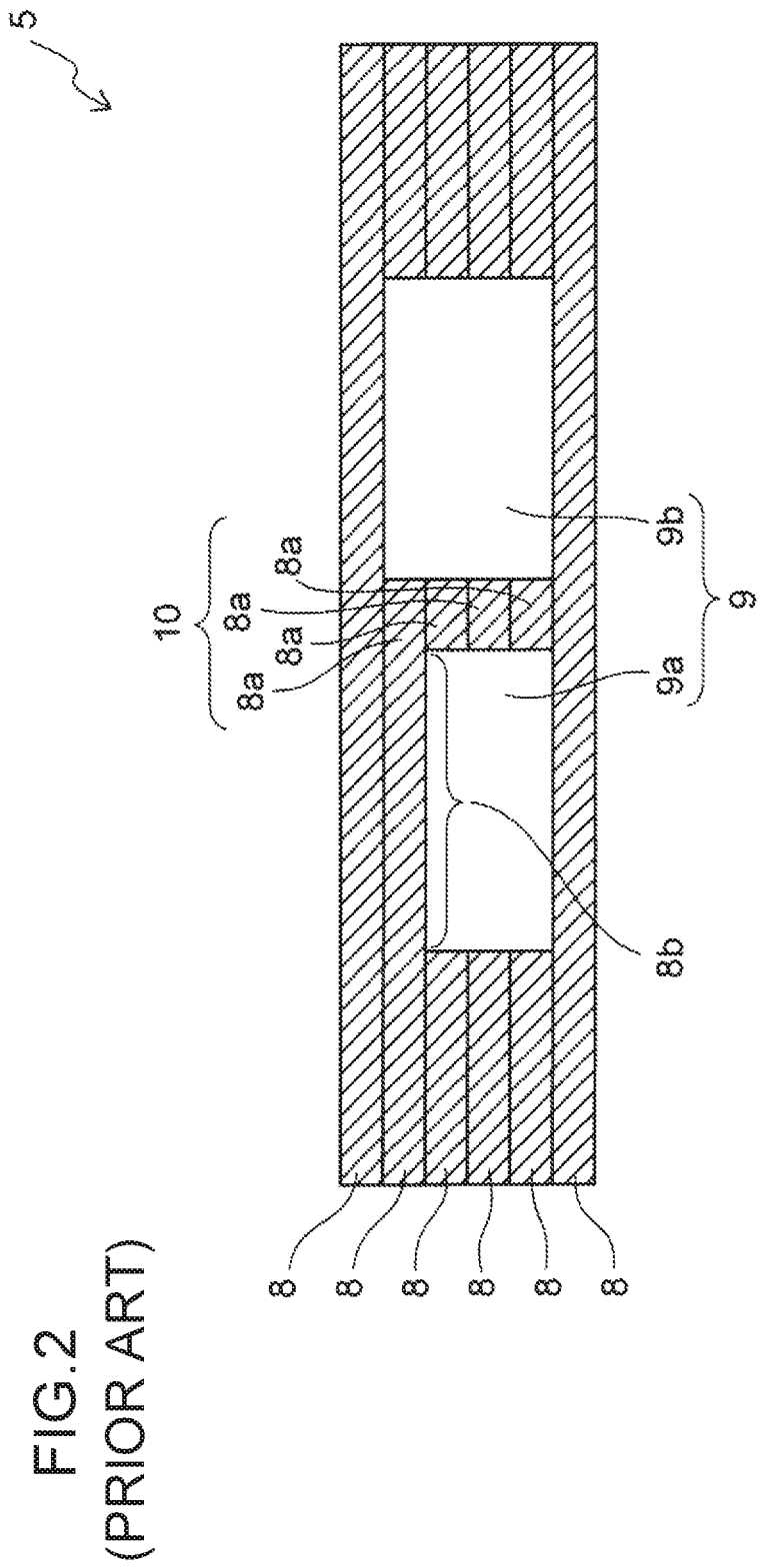
FIG. 2 is a sectional view of a vapor pipe taken along a line I-I of FIG. 1.

FIG. 2 is a sectional view of the vapor pipe 5 taken along a line I-I of FIG. 1.

In the example as shown in FIG. 2, a laminate of metal layers 8 is pressurized from above and below while being heated. As a result, the metal layers 8 are bonded to one another by metal-to-metal bonding to thereby form the pipe conduit 9. In addition, a support column portion 8a is formed in each of the metal layers 8 except the uppermost metal layer 8 and the lowermost metal layer 8 so that a support column 10 is formed by a laminate of the support column portions 8a. The support column 10 functions to prevent the vapor pipe 5 from being crushed when the metal layers 8 are pressurized as described above. In addition, even in a case where the pipe conduit 9 can be bent as will be described later, the support column 10 can be used to prevent the pipe conduit 9 from being crushed when the pipe conduit 9 is bent. The pipe conduit 9 is divided into a first flow path 9a and a second flow path 9b by the support column 10.

Incidentally, the metal layers 8 are formed by patterning copper layers, or the like by wet etching. However, connection portions 8b are provided in the metal layers 8 in order to prevent the support column portions 8a from being separated from the metal layers 8 during the wet etching.

Figure 3:
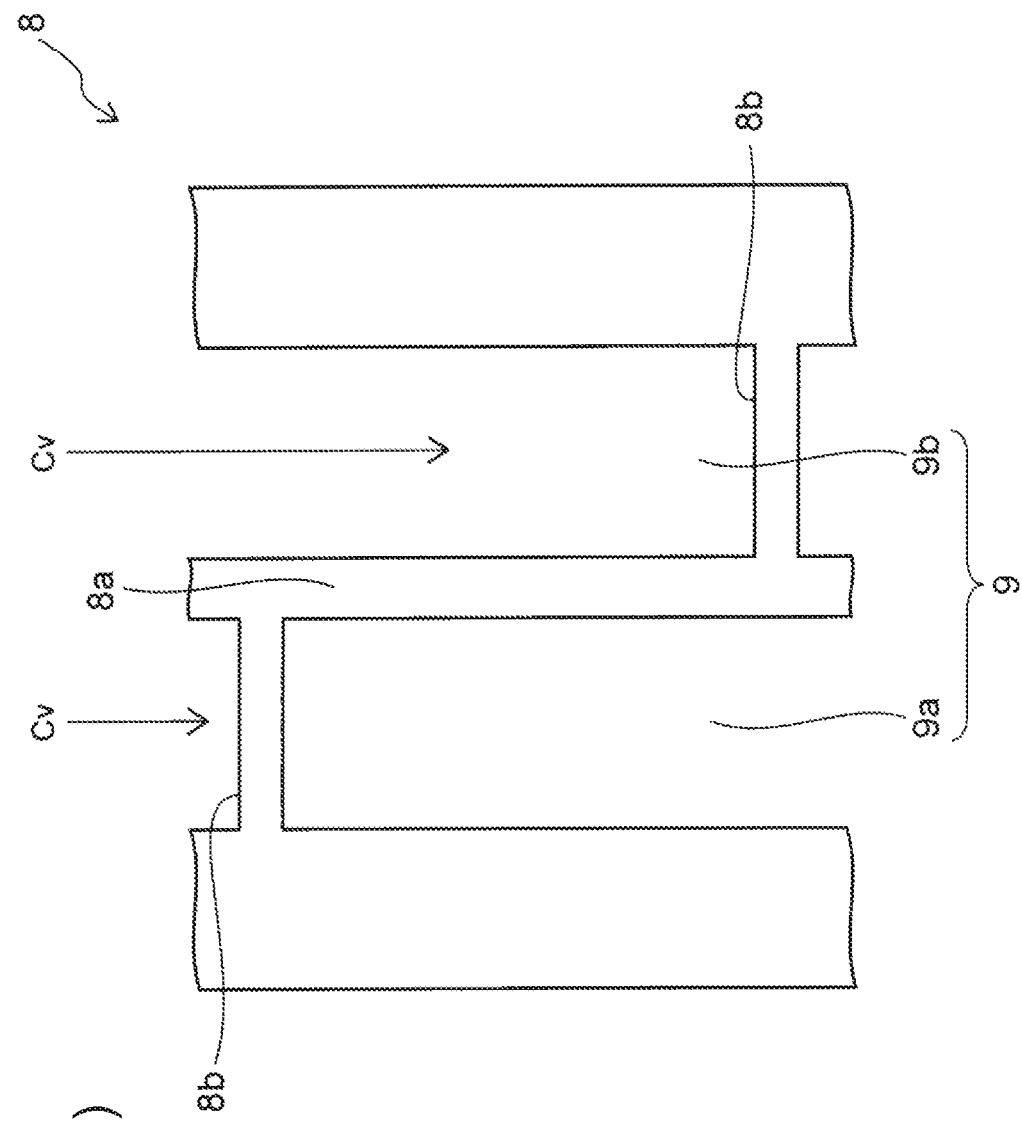
FIG. 3 is an enlarged plan view of one metal layer where a support column portion has been formed.

FIG. 3 is an enlarged plan view of one metal layer 8 where the support column portion 8a has been formed.

As shown in FIG. 3, the support column portion 8a is formed to extend along the pipe conduit 9. In addition, since the support column portion 8a is supported by the metal layer 8 through connect portions 8b, the support column portion 8a and the metal layer 8 can be handled integrally.

Incidentally, when the positions of the connection portions 8b are set to be the same in all the metal layers 8, the pipe conduit 9 is closed by the connection portions 8b. For this reason, it is preferable that the positions of the connection portions 8 vary from one metal layer 8 to another.

According to such a loop type heat pipe 1, the metal layers 8 are laminated in the aforementioned manner so that a thickness of the loop type heat pipe 1 can be reduced to thereby help on reduction of a thickness of the housing 2.

Moreover, the support column 10 is formed inside the vapor pipe 5. Accordingly, the support column 10 can be used to prevent the vapor pipe 5 from being crushed by the pressure when the respective metal layers 8 are pressurized to be bonded to one another. Thus, the vapor pipe 5 can be prevented from being crushed so that the flow of the vapor Cv can be prevented from being stagnated inside the loop type heat pipe 1.

However, when the support column 10 is formed thus, the flow of the vapor Cv in the vapor pipe 5 is hindered by the support column 10. Accordingly, pressure loss in the vapor pipe 5 increases to thereby lead to deterioration of heat transport efficiency of the loop type heat pipe 1.

Further, in portions of the vapor pipe 5 where the connection portions 8b are formed, a sectional area of the pipe conduit 9 is narrowed due to the connection portions 8b so that the pressure loss in the vapor pipe 5 further increases.

The present embodiment in which deterioration of heat transport ability of a loop type heat pipe can be suppressed will be described below.

Present Embodiment

Figure 4:
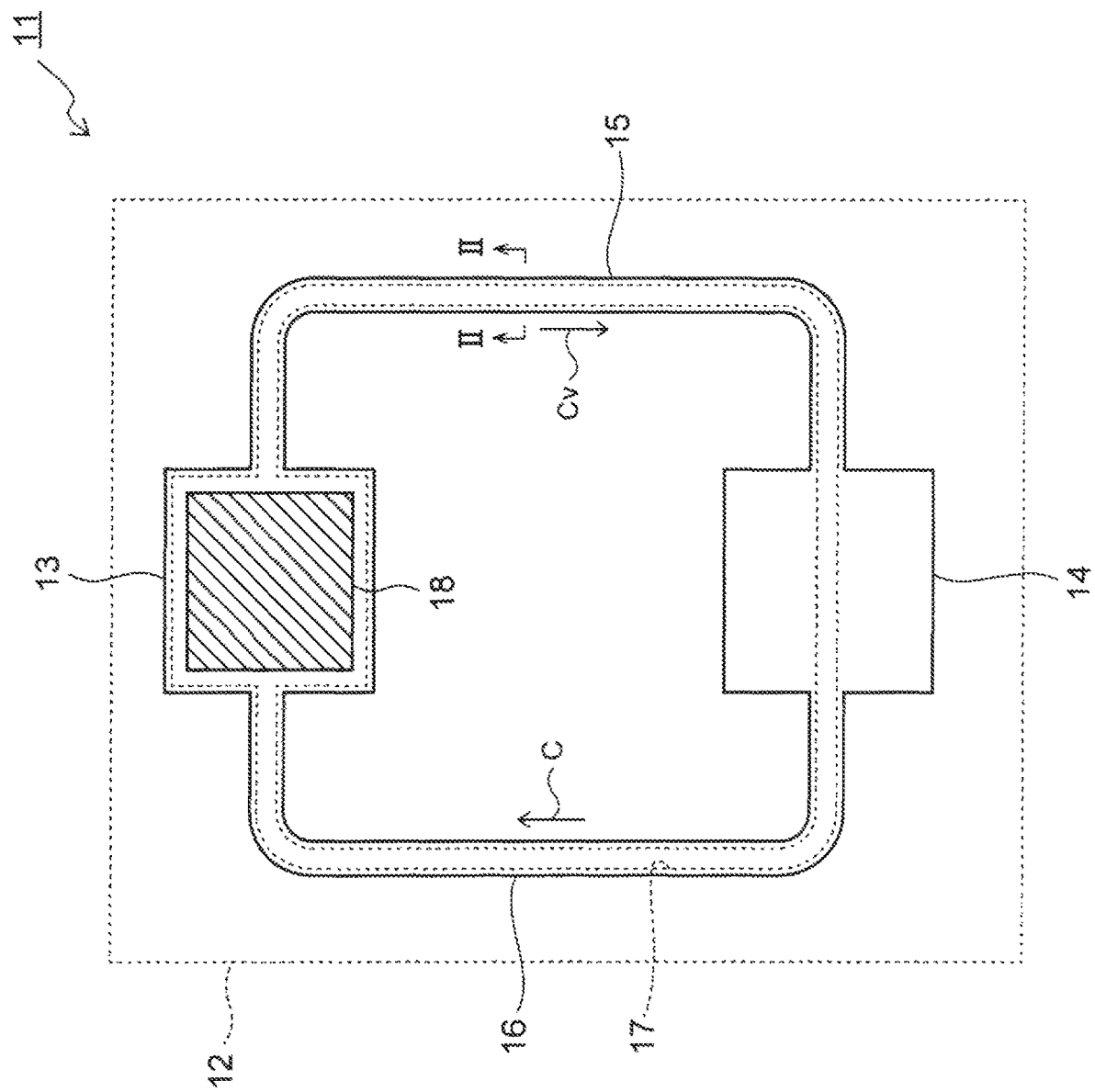
FIG. 4 is a top view of a loop type heat pipe according to an embodiment of the present invention.

FIG. 4 is a top view of the loop type heat pipe according to the present embodiment.

The loop type heat pipe 11 is received in a housing 12 of an electronic apparatus. The loop type heat pipe 11 is provided with an evaporator 13 and a condenser 14. The electronic apparatus is not limited particularly as long as the electronic apparatus is an apparatus having a heat generating component to be cooled. For example, any of a smartphone, a digital camera, an artificial satellite, an on-vehicle electronic apparatus and a server can be used as the electronic apparatus.

A vapor pipe 15 and a liquid pipe 16 are connected to the evaporator 13 and the condenser 14. Thus, a loop-like pipe conduit 17 through which a working fluid C flows is formed by the pipes 15 and 16. In addition, a heat generating component 18 such as a CPU is fixedly bonded to the evaporator 13. Vapor Cv of the working fluid C is formed by heat of the heat generating component 18.

After the vapor Cv is guided to the condenser 14 through the vapor pipe 15 to be liquefied in the condenser 14, the resulting working fluid C is supplied again to the evaporator 13 through the liquid pipe 16.

The working fluid C circulates thus in the loop type heat pipe 11. Accordingly, the heat generated by the heat generating component 18 can move to the condenser 14 so that cooling of the heat generating component 18 can be accelerated.

Figure 5:
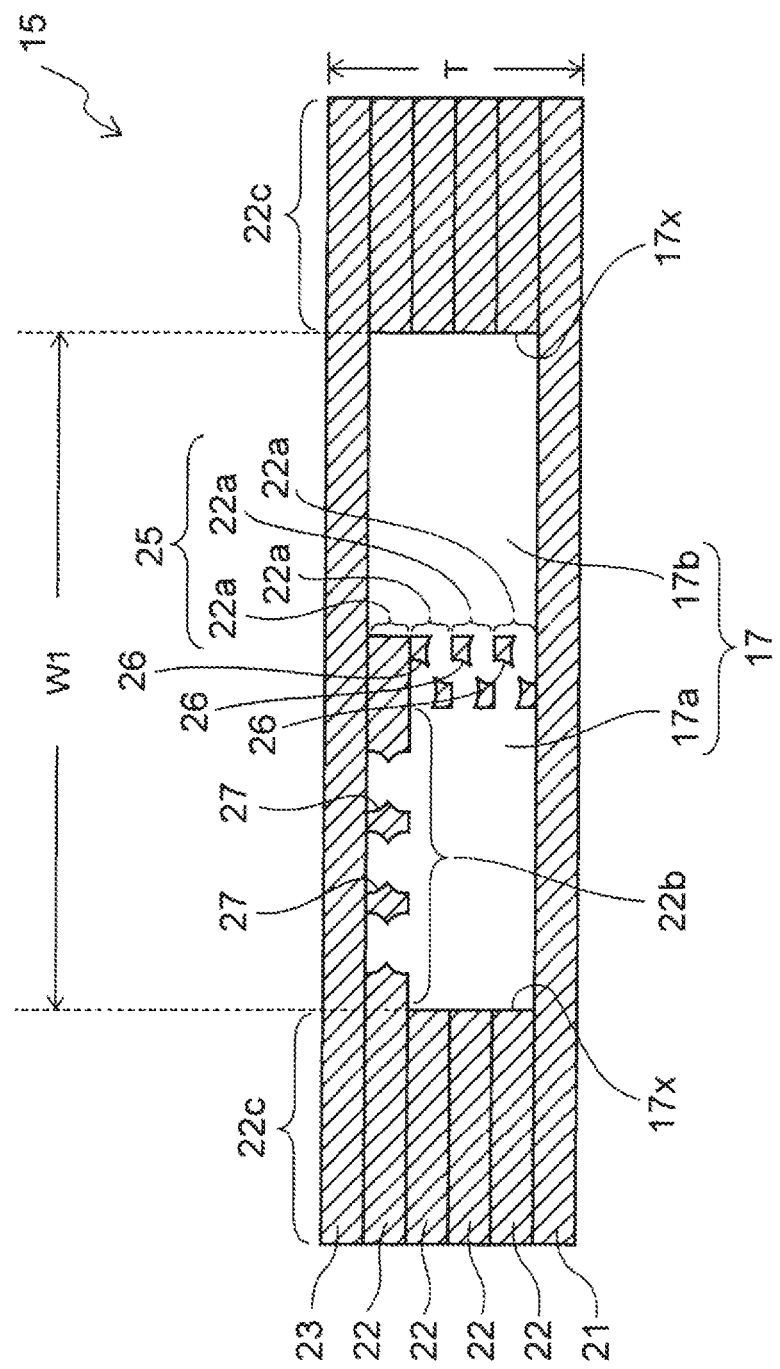
FIG. 5 is a sectional view of a vapor pipe taken along a line II-II of FIG. 4.

FIG. 5 is a sectional view of the vapor pipe 15 taken along a line II-II of FIG. 4.

In the present embodiment, as shown in FIG. 5, a lower-side metal layer 21, intermediate metal layers 22, and an upper-side metal layer 23 are laminated in the named order so that the loop type heat pipe 11 is produced.

Support column portions 22a constituting a support column 25 are formed respectively in the intermediate metal layers 22 of the metal layers. The pipe conduit 17 is divided into a first flow path 17a and a second flow path 17b by the support column 25.

In addition, pipe wall portions 22c defining pipe walls 17x of the pipe conduit 17 are provided in each of the intermediate metal layers 22. Further, the lower-side metal layer 21 closes the pipe conduit 17 from the lower side, and the upper-side metal layer 23 closes the pipe conduit 17 from the upper side. Incidentally, connection portions 22b connected to the support column portion 22a are provided in the uppermost intermediate metal layer 22. Such connection portions 22b are not formed in only the uppermost intermediate metal layer 22 but formed in each of the intermediate metal layers 22.

Each of the lower-side metal layer 21 and the upper-side metal layer 23 is bonded to the support column 25. Thus, the pipe conduit 17 can be prevented from being crushed by pressure when the respective metal layers 21 to 23 are laminated to one another. In addition, due to the connection portions 22b through which each intermediate metal layer 22 and the support column portion 22a are connected to each other, the support column portion 22a can be prevented from being separated from the intermediate metal layer 22 even when the intermediate metal layer 22 and the support column portion 22a are formed into one metal layer.

Incidentally, a part of the pipe conduit 17 where the support column 25 should be formed is not particularly limited. However, it is preferable that the support column 25 is formed in the vapor pipe 15 that is hollow inside to be easily crushed as in the example. For the same reason, the support column 25 may be also formed in the pipe conduit 17 in the condenser 14 (see FIG. 4).

On the other hand, a not-shown wick for moving the liquid-phase working fluid C to the evaporator 13 by capillarity is formed inside the liquid pipe 16 (see FIG. 4). Since the liquid pipe 16 is reinforced by the wick, a support column 25 does not have to be provided in the liquid pipe 16.

In addition, although also depending on heat transport performance etc. required of the loop type heat pipe 11, a width W1 of the pipe conduit 17 is, for example, set at about 5 mm to about 10 mm in this example.

The material of each of the metal layers 21 to 23 is also not limited particularly. A copper layer excellent in thermal conductivity and machinability can be used as the metal layer 21 to 23. Incidentally, an aluminum layer or a stainless steel layer may be used as the metal layer 21 to 23 in place of the copper layer.

Further, a thickness of each of the metal layers 21 to 23 is 100 µm to 300 µm, e.g. about 100 µm. A total thickness T of the metal layers 21 to 23 is in a range of from about 600 µm to about 1,800 µm.

When the metal layers 21 to 23 each of which is such thin in thickness are laminated to one another, a thickness of the loop type heat pipe 11 can be thinned to thereby contribute to reduction of a thickness of the housing 12 where the loop type heat pipe 11 is received.

In addition, in order to prevent pressure loss in the pipe conduit 17 from increasing due to use of the support column portions 22a or the connection portions 22b, in this example, first opening portions 26 are formed in each of the support column portions 22a and second opening portions 27 are formed in each of the connection portions 22b.

FIG. 6 is an enlarged plan view of the intermediate metal layer 22 in the vapor pipe 15.

As show in FIG. 6, the support column portion 22a is formed to extend along an extension direction X of the pipe conduit 17. Although a width W2 of the support column portion 22a is not limited particularly, the width W2 is set at about 500 µm to about 3,000 µm in this example.

The first opening portions 26 are formed in the support column portion 22a to connect the first flow path 17a and the second flow path 17b to each other. Thus, vapor Cv can circulate between the first flow path 17a and the second flow path 17b through the first opening portions 26. In addition, a sectional area of the pipe conduit 17 increases by an amount corresponding to sectional areas of the first opening portions 26. Accordingly, the pressure loss of the vapor Cv in the pipe conduit 17 can be reduced.

On the other hand, each of the connection portions 22b extends along a direction Y perpendicular to the extension direction X. A width W3 of the connection portion 22b is, for example, in a range of from about 500 µm to about 2,000 µm. The second opening portions 27 are formed to penetrate the connection portion 22b along the extension direction X so that the vapor Cv can flow through the second opening portions 27 along the extension direction X.

Thus, the vapor Cv can more easily flow through each of the flow paths 17a and 17b than that in a case where the second opening portions 27 are absent. Accordingly, the pressure loss of the vapor Cv in the pipe conduit 17 can be further reduced.

The shape of each of the opening portions 26 and 27 is not limited particularly.

Figure 7A:
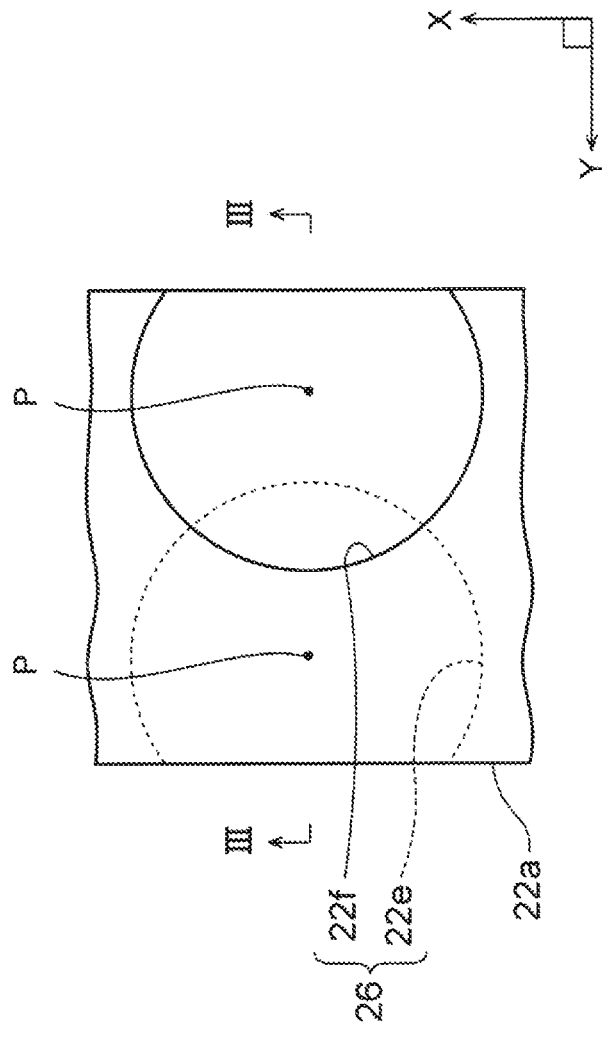
FIG. 7A is an enlarged plan view of a first opening portion according to the present embodiment.
Figure 7B:
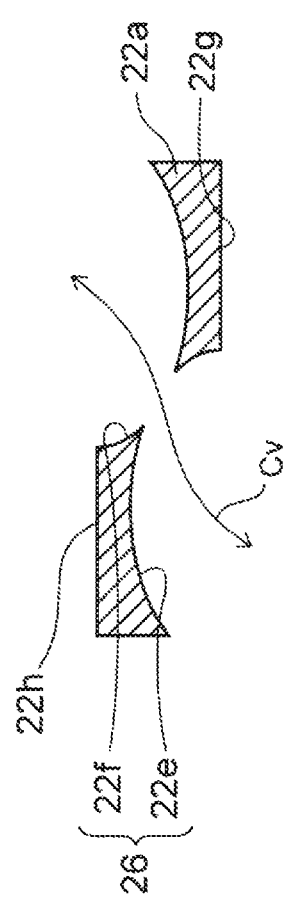
FIG. 7B is a sectional view taken along a line III-III of FIG. 7A.

FIG. 7A is an enlarged plan view of the first opening portion 26. FIG. 7B is a sectional view taken along a line III-III of FIG. 7A.

As shown in FIG. 7A, a first hole 22e and a second hole 22f constituting each of the first opening portions 26 are formed in the support column portion 22a. Each of the holes 22e and 22f is bottomed and schematically shaped like a circle in plan view.

In this example, centers P of the holes 22e and 22f are shifted from each other in the aforementioned direction Y while the holes 22e and 22f are connected to each other. Thus, the vapor Cv is made to flow through the first opening portion 26 along the direction Y.

Incidentally, the size of each of the holes 22e and 22f is not limited particularly. However, the diameter of the hole 22e, 22f is set at about 200 µm in this example.

As shown in FIG. 7B, the first hole 22e is formed in a lower surface 22g of the support column portion 22a, and the second hole 22f is formed in an upper surface 22h opposite to the lower surface 22g. The holes 22e and 22f are formed by isotropically etching the metal layer such as the copper layer by wet etching. Accordingly, each of the holes 22e and 22f has a round shape in section.

On the other hand, FIG. 8A is an enlarged plan view of each of the second opening portions 27. FIG. 8B is a sectional view taken along a line IV-IV of FIG. 8A.

As shown in FIGS. 8A and 8B, the second opening portion 27 is also constituted by the aforementioned first hole 22e and the aforementioned second hole 22f.

Centers P of the holes 22*e* and 22*f* are shifted from each other in the aforementioned extension direction X. Thus, the vapor Cv is made to flow through the second opening portion 27 along the extension direction X.

Figure 9A:
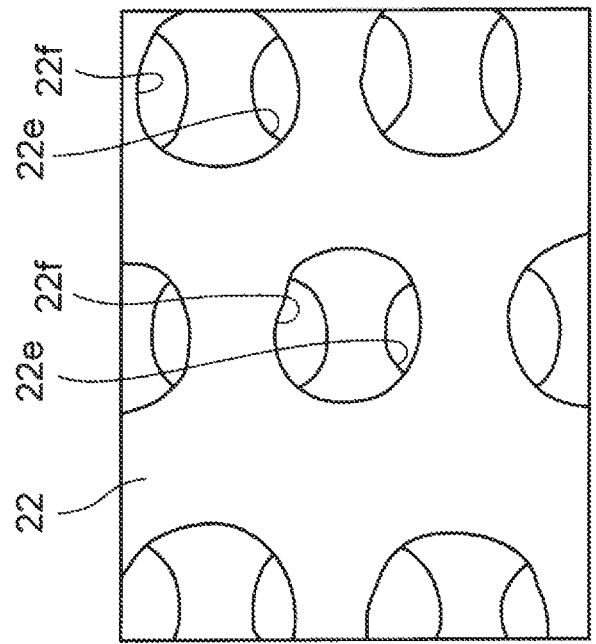
FIG. 9A is a view drawn based on an enlarged photograph of one intermediate metal layer where first holes and second holes are formed according to the present embodiment.
Figure 9B:
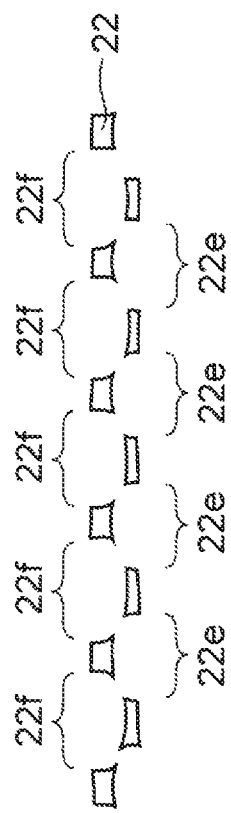
FIG. 9B is a view drawn based on an enlarged photograph of a section of the intermediate metal layer.

FIG. 9A is a view that is drawn based on an enlarged photograph of one intermediate metal layer 22 where holes 22*e* and 22*f* are formed. FIG. 9B is a view that is drawn based on an enlarged photograph of a section of the intermediate metal layer 22.

As shown in FIG. 9A, the holes 22*e* and 22*f* are formed to overlap with one another while centers of the holes 22*e* and 22*f* are shifted from one another. Of them, the diameter of the first holes 22*e* is about 200 μm as described above, and a pitch of the first holes 22*e* is about 300 μm. The second holes 22*f* also has the same diameter and the same pitch as the first holes 22*e*.

In addition, as shown in FIG. 9B, each of the holes 22*e* and 22*f* is schematically shaped like a hemisphere in sectional view.

Figure 10:
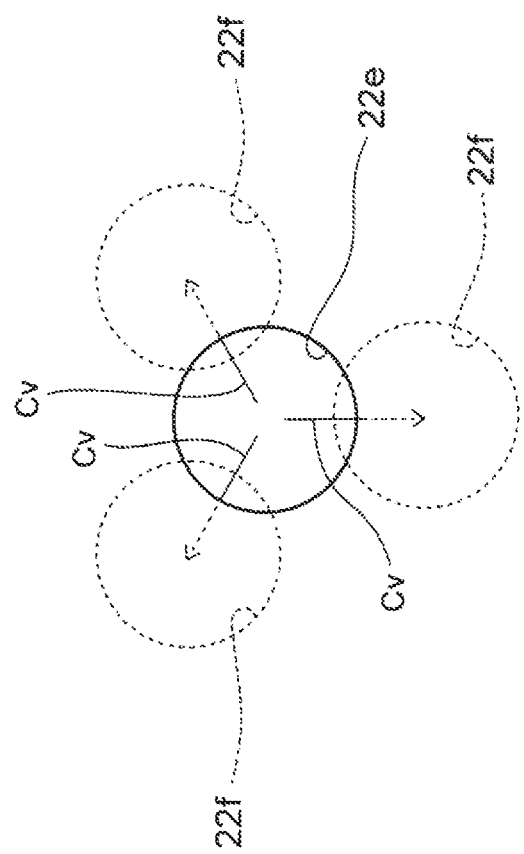
FIG. 10 is a plan view showing a positional relation between a first hole in an upper-side intermediate metal layer and second holes in a lower-side intermediate metal layer in the intermediate metal layers adjacent to each other in an up/down direction according to the present embodiment.

FIG. 10 is a plan view showing a positional relation between a first hole 22*e* in an upper-side intermediate metal layer 22 and second holes 22*f* in a lower-side intermediate metal layer 22 in the intermediate metal layer 22 adjacent to each other in an up/down direction.

In this example, as shown in FIG. 10, the first hole 22*e* in the upper-side intermediate metal layer 22 and each of the second holes 22*f* in the lower-side intermediate metal layer 22 are shifted from each other while being overlapped with each other in plan view.

Thus, vapor Cv flows through each of the holes 22*e* and 22*f* three-dimensionally. Consequently, resistance received by the vapor Cv from the aforementioned support column 25 or the aforementioned connection portions 22*b* can be reduced.

Figure 11:
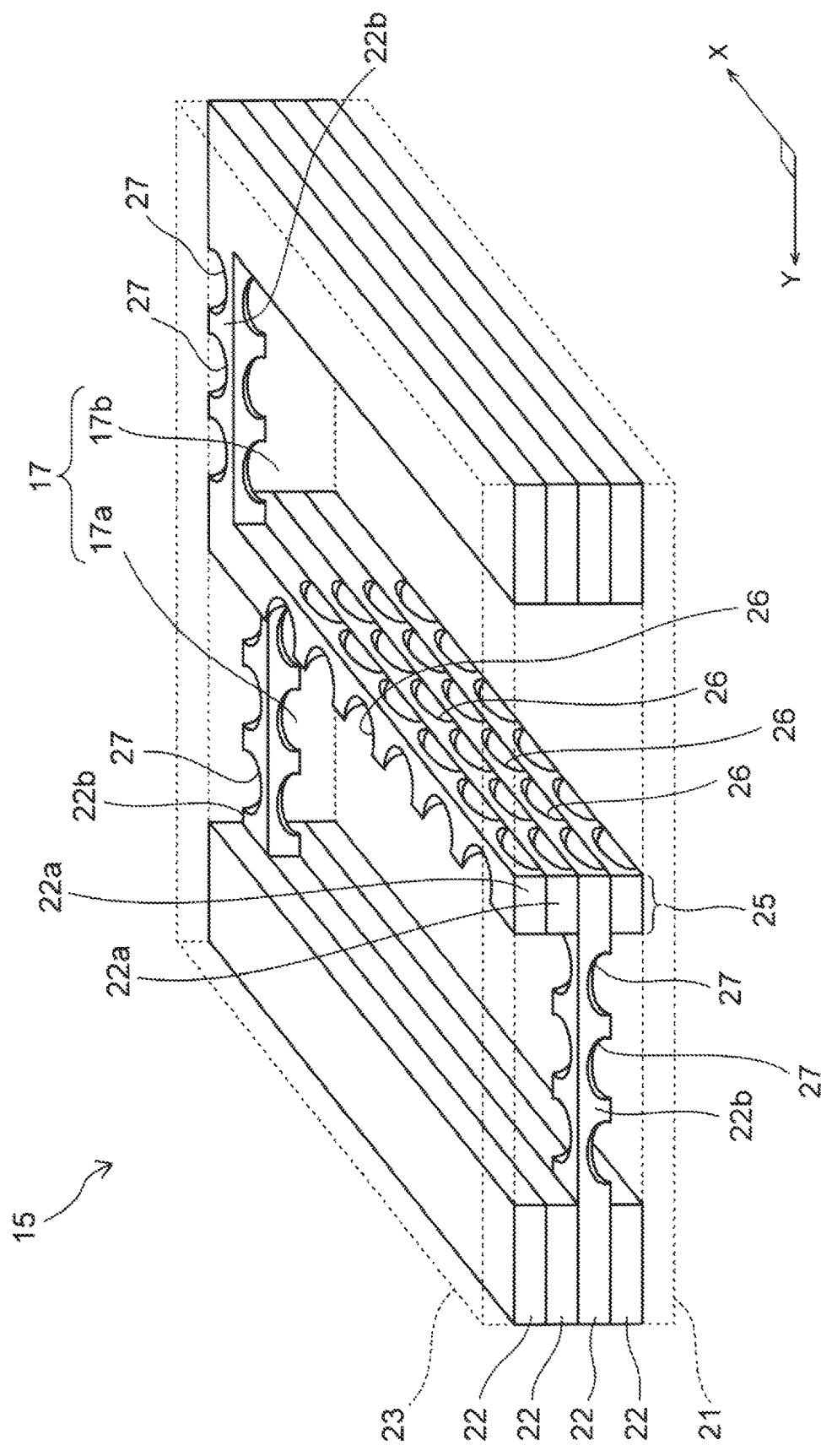
FIG. 11 is an exploded perspective view of the vapor line according to the present embodiment.

FIG. 11 is an exploded perspective view of a vapor pipe 15.

As shown in FIG. 11, opening portions 26 or 27 are formed in each support column portion 22*a* or each connection portion 22*b*. Thus, the support column portion 22*a* and the connection portion 22*b* are porous. As a result, capillarity for discharging a liquid-phase working fluid C having stagnated in one of flow paths 17*a* and 17*b* to the other acts on the working fluid C from the porous support column portion 22*a*. Therefore, even when the liquid-phase working fluid C is condensed into dew in one of the flow paths 17*a* and 17*b* due to a decline of outside air temperature or the like, the working fluid C can be easily discharged to the other flow path. Accordingly, liquid stagnation can hardly occur inside the pipe conduit 17 so that pressure loss in the pipe conduit 17 can be prevented from increasing due to the liquid stagnation.

On the other hand, in order to prevent the pipe conduit 17 from being closed by the connection portions 22*b*, the connection portions 22*b* are provided at positions varying from one intermediate metal layer 22 to another.

According to the present embodiment that has been described above, the first opening portions 26 connecting the flow paths 17*a* and 17*b* to each other are formed in the support column 25, as shown in FIG. 5. Accordingly, the sectional area of the pipe conduit 17 can increase by the amount corresponding to the sectional areas of the first opening portions 26 so that the pressure loss of the vapor Cv in the pipe conduit 17 can be reduced.

Moreover, the second opening portions 27 are formed in each of the connection portions 22*b*. Accordingly, the vapor Cv can easily flow through each of the flow paths 17*a* and 17*b* so that the pressure loss of the vapor Cv in the pipe conduit 17 can be further reduced.

The pressure loss in the pipe conduit 17 is reduced thus. Accordingly, heat transport efficiency of the loop type heat pipe 11 can be improved so that the increase of temperature of the heat generating component 18 (see FIG. 4) can be suppressed efficiently.

Incidentally, when the pressure loss in the pipe conduit 17 can be reduced sufficiently by only the first opening portions 26, the second opening portions 27 do not have to be formed in the connection portions 22*b*.

Next, a manufacturing method of the loop type heat pipe 11 according to the present embodiment will be described.

Figure 12:
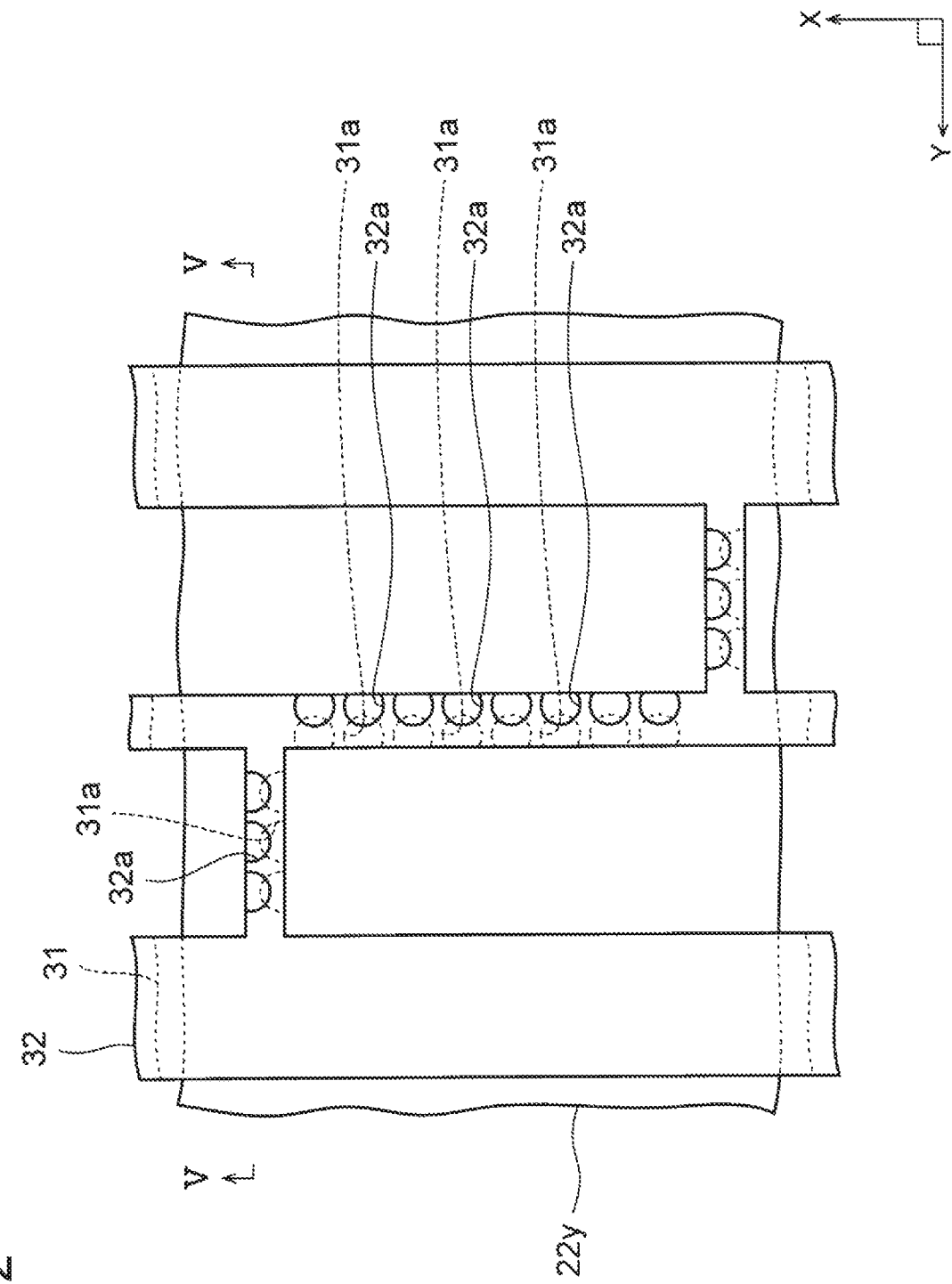
FIG. 12 is a plan view for explaining a manufacturing method of one intermediate metal layer according to the present embodiment (Part 1)
Figure 13:
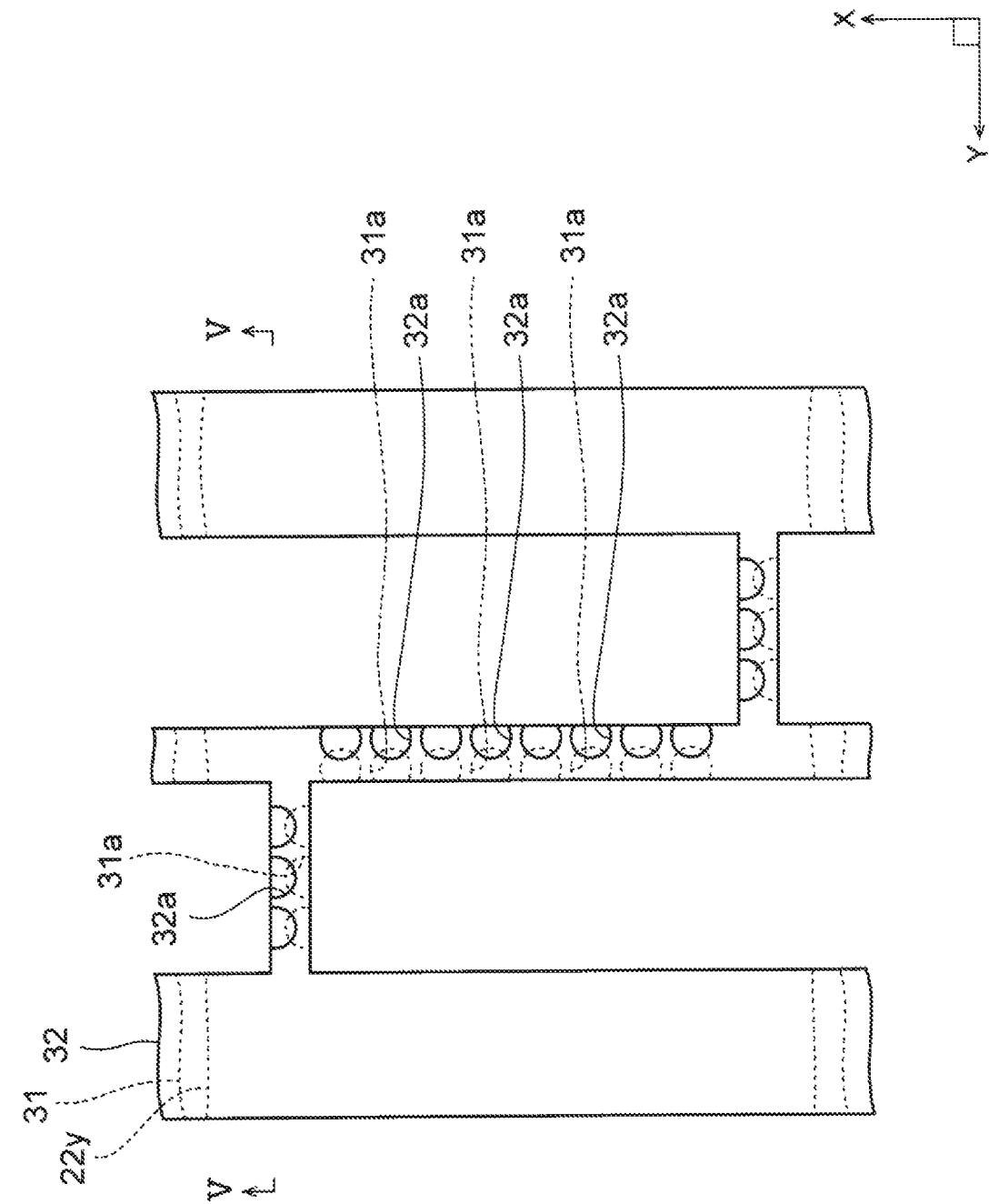
FIG. 13 is a plan view for explaining the manufacturing method of the intermediate metal layer according to the present embodiment (Part 2)
Figure 14:
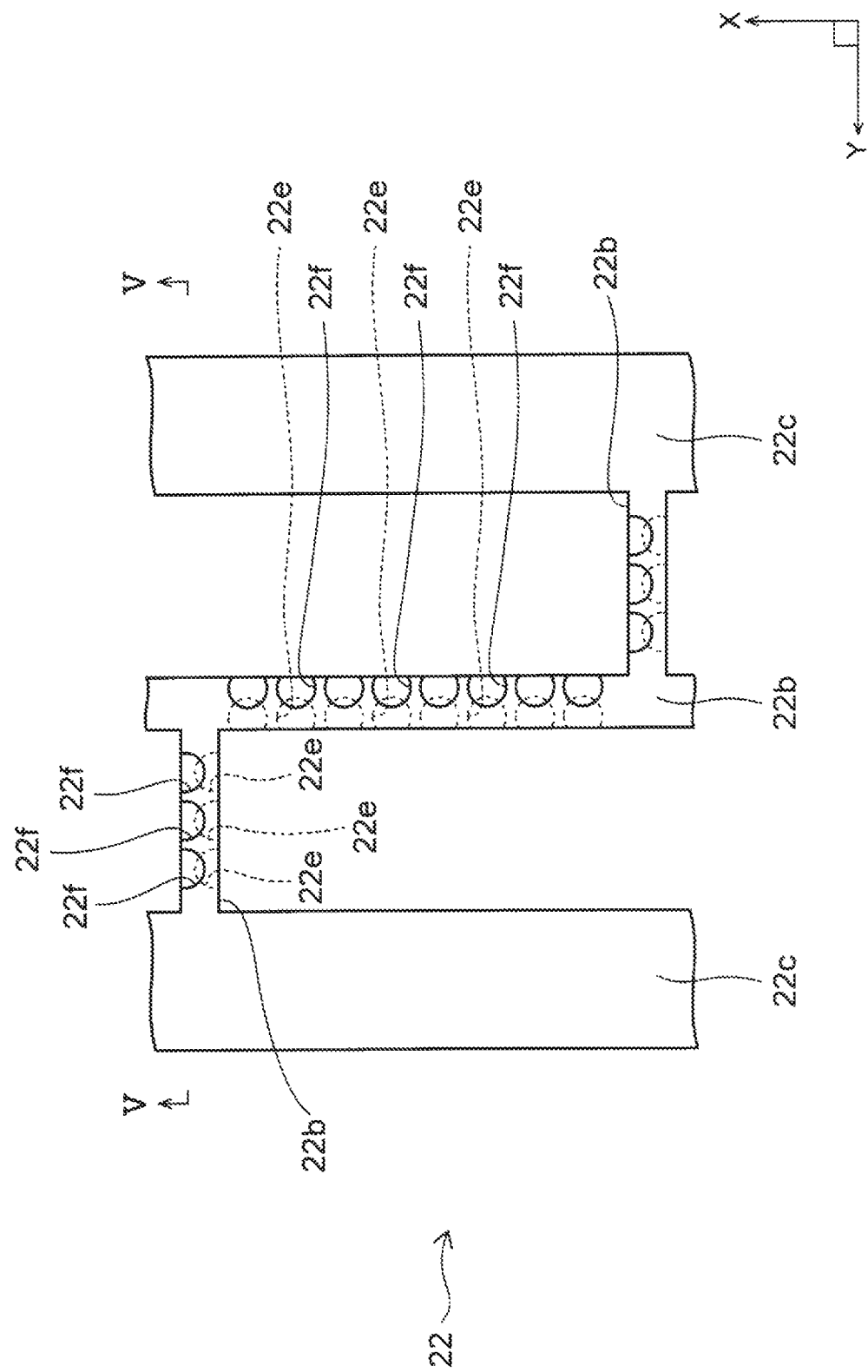
FIG. 14 is a plan view for explaining the manufacturing method of the intermediate metal layer according to the present embodiment (Part 3)
Figure 16:
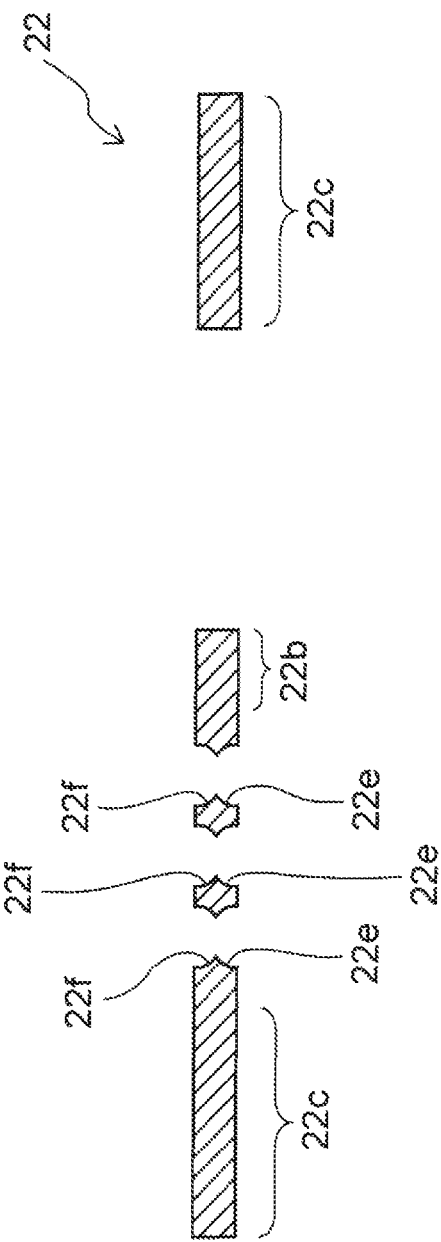
FIG. 16 is a sectional view for explaining the manufacturing method of the intermediate metal layer according to the present embodiment (Part 2)

FIGS. 12 to 14 are plan views for explaining a manufacturing method of one intermediate metal layer 22. In addition, FIGS. 15A and 15B and FIG. 16 are sectional views for explaining the manufacturing method of the intermediate metal layer 22. FIGS. 15A and 15B and FIG. 16 correspond to sectional views taken along a line V-V of FIGS. 12 to 14.

First, as shown in FIG. 12 and FIG. 15A, a copper layer is prepared as a metal layer 22*y*, and a first resist layer 31 and a second resist layer 32 are formed on opposite surfaces of the copper layer. The resist layers 31 and 32 have the same outlines as the intermediate metal layer 22 in plan view. In addition, the resist layers 31 and 32 have circular first resist openings 31*a* and circular second resist openings 32*a* corresponding to holes 22*e* and 22*f* respectively.

Next, as shown in FIG. 13 and FIG. 15B, the metal layer 22*y* is wet-etched from its opposite surfaces with the resist layers 31 and 32 as masks. Thus, the metal layer 22*y* is patterned into the intermediate metal layer 22, and the holes 22*e* and 22*f* connected to each other respectively are formed under the resist openings 31*a* and 32*a* respectively. In addition, since the wet etching proceeds isotropically, each of the holes 22*e* and 22*f* is shaped like a hemisphere.

Further, in the step, portions of the metal layer 22*y* on which both the first resist layer 31 and the second resist layer 32 are formed are not etched but left as pipe wall portions 22*c*.

Then, the respective resist layers 31 and 32 are removed. As a result, a basic structure of the intermediate metal layer 22 is completed, as shown in FIGS. 14 and 16.

Steps after that will be described with reference to FIGS. 17 and 18.

Figure 17:
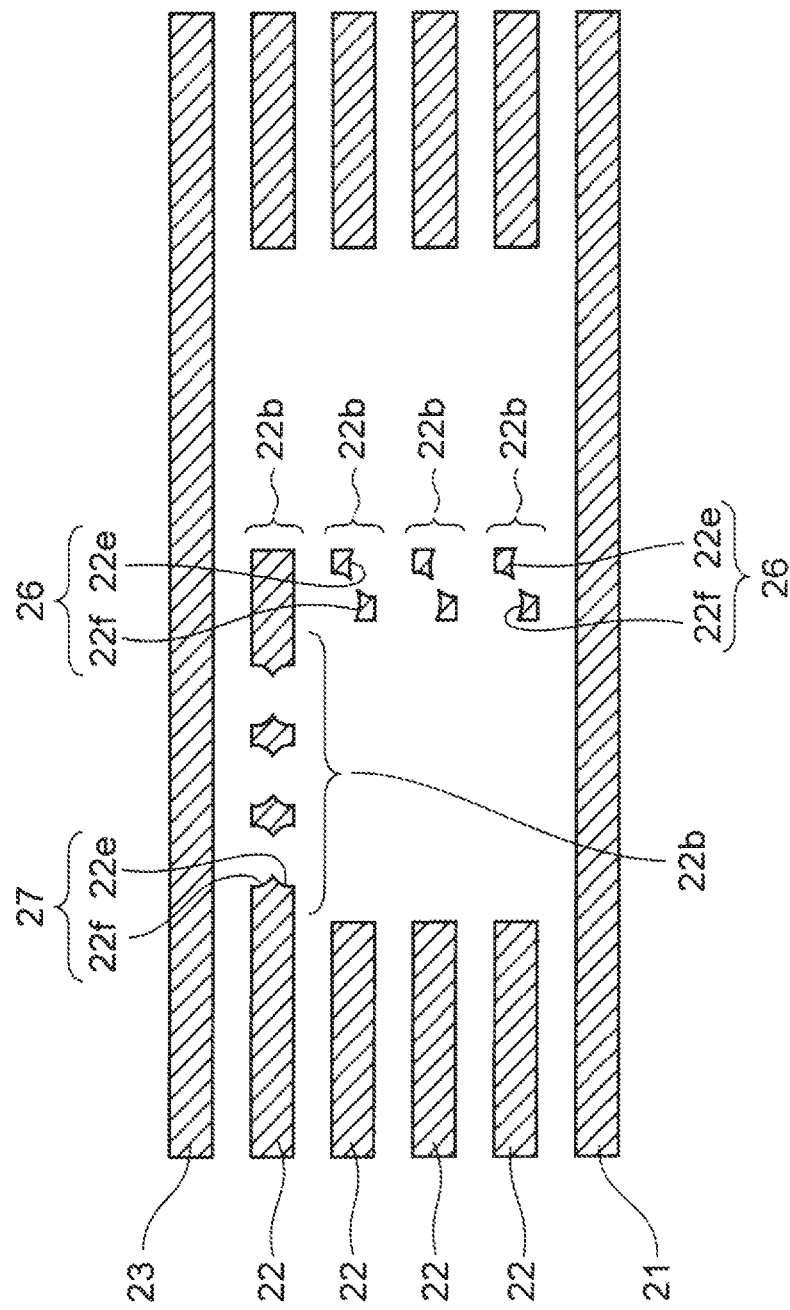
FIG. 17 is a sectional view in process of manufacturing the loop type heat pipe according to the present embodiment (Part 1)
Figure 18:
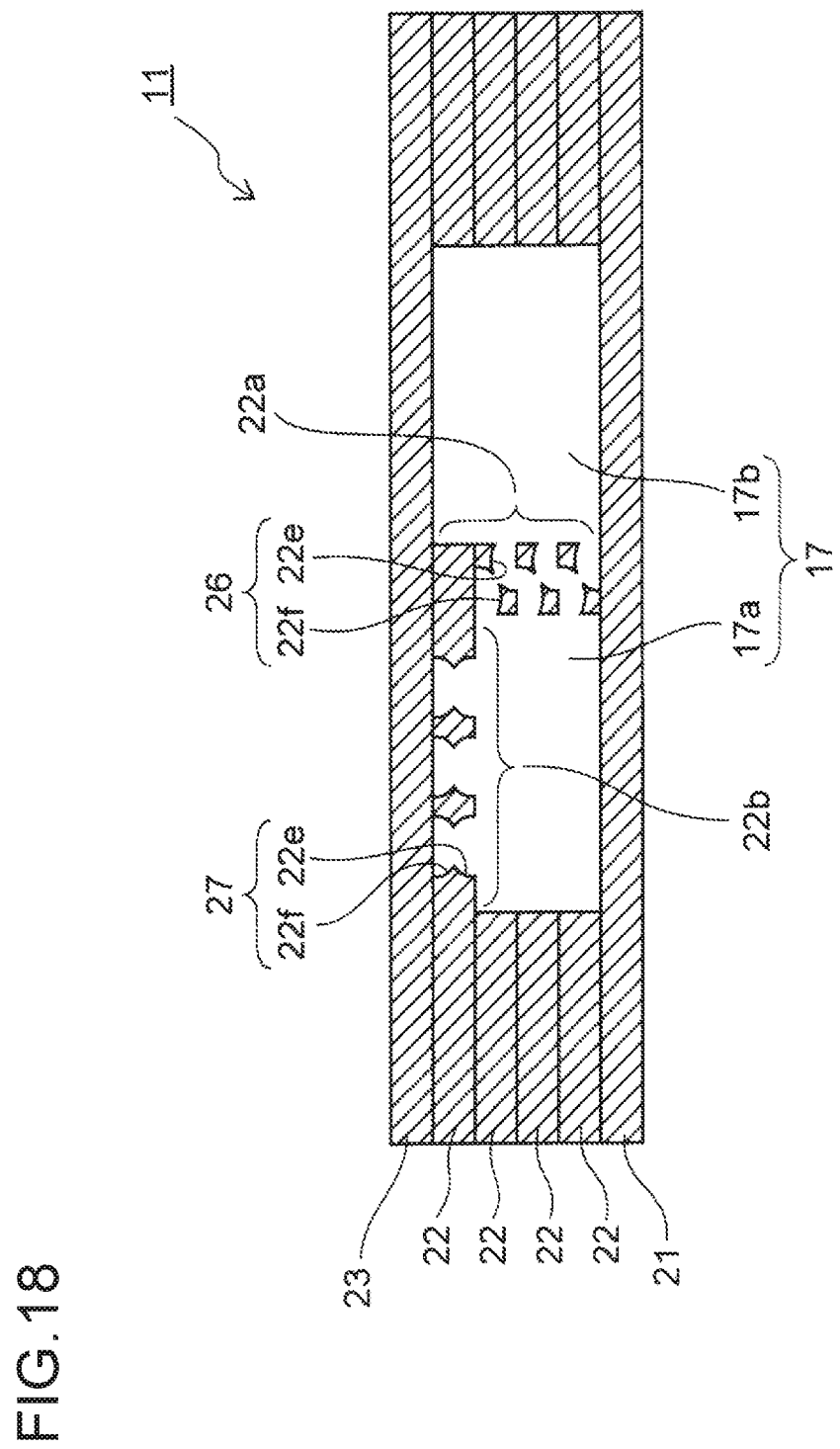
FIG. 18 is a sectional view in process of manufacturing the loop type heat pipe according to the present embodiment (Part 2)

FIGS. 17 and 18 are sectional views in process of manufacturing the loop type heat pipe 11 according to the present embodiment.

First, as shown in FIG. 17, a lower-side metal layer 21, a plurality of intermediate metal layers 22 and an upper-side metal layer 23 are laminated in the named order.

Next, as shown in FIG. 18, the respective metal layers 21 to 23 are pressed against one another by pressure of about 10 MPa while the respective metal layers 21 to 23 are heated at a temperature not lower than 500° C., e.g. at 700° C. Thus, the respective metal layers 21 to 23 are bonded to one another by metal-to-metal bonding, and a pipe conduit 17 is closed from below and above by the lower-side metal layer 21 and the upper-side metal layer 23 respectively.

Then, water is injected as a working fluid C into the pipe conduit 17 through a not-shown injection port. As a result, a basic structure of the loop type heat pipe 11 according to the present embodiment is completed.

Various modifications of the present embodiment will be described below.

First Modification

Figure 19:
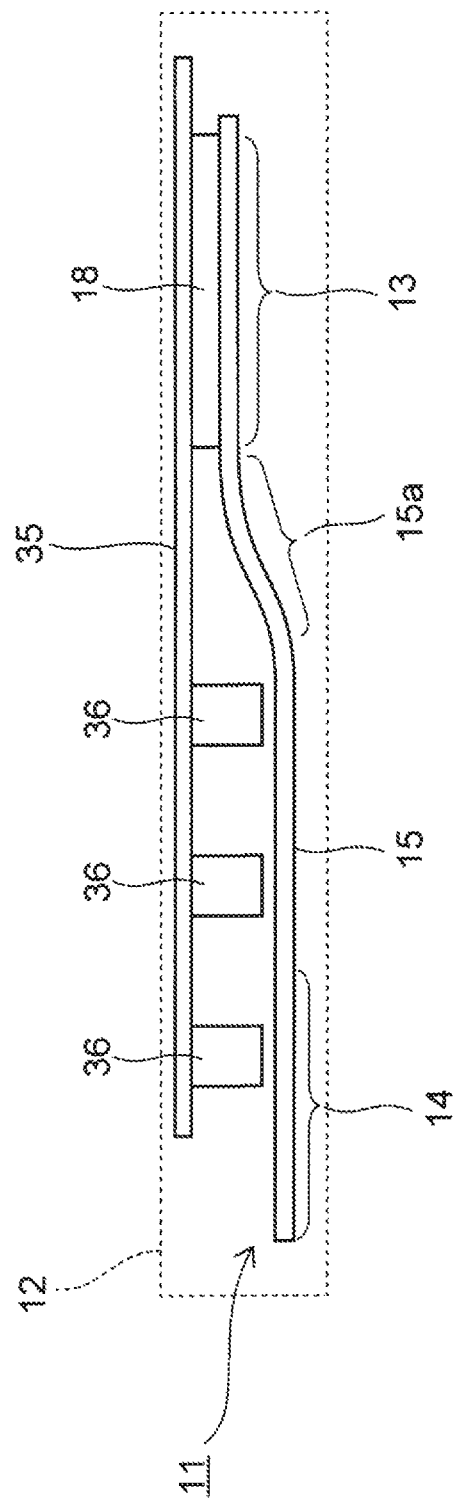
FIG. 19 is a side view of a loop type heat pipe according to a first modification of the present embodiment.

FIG. 19 is a side view of a loop type heat pipe 11 according to a first modification.

In this example, a heat generating component 18 such as a CPU is mounted on a circuit substrate 35, and electronic components 36 higher in height than the heat generating component 18 are mounted on the circuit substrate 35. For example, a chip capacitor is used as each of such electronic components 36.

A bent portion 15a is provided in a vapor pipe 15 by bending to thereby prevent the vapor pipe 15 from contacting the electronic components 36.

The vapor pipe 15 is reinforced by a support column 25 (see FIG. 11).

Accordingly, even when the vapor pipe 15 is bent thus, the vapor pipe 15 can be suppressed from being crushed to increase pressure loss of vapor Cv.

Second Modification

Figure 20:
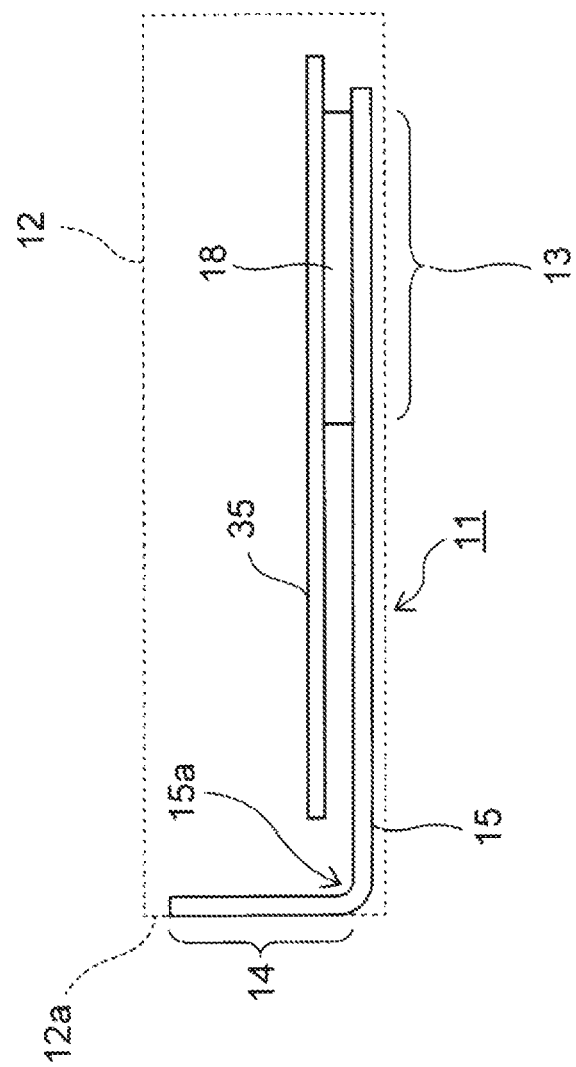
FIG. 20 is a side view of a loop type heat pipe according to a second modification of the present embodiment.

FIG. 20 is a side view of a loop type heat pipe 11 according to a second modification.

In this example, a vapor pipe 15 is bent. As a result, a bent portion 15a bent by about 90° in side view is provided in the vapor pipe 15 to thereby bring a condenser 14 into tight contact with a side surface 12a of a housing 12. Thus, the side surface 12a can be used effectively because heat of the condenser 14 can be released to the outside through the side surface 12a.

Further, the vapor pipe 15 is reinforced by a support column 25 (see FIG. 11) in a similar manner to or the same manner as in the first modification. Accordingly, the vapor pipe 15 can be also prevented from being crushed by the bending.

Third Modification

Figure 21:
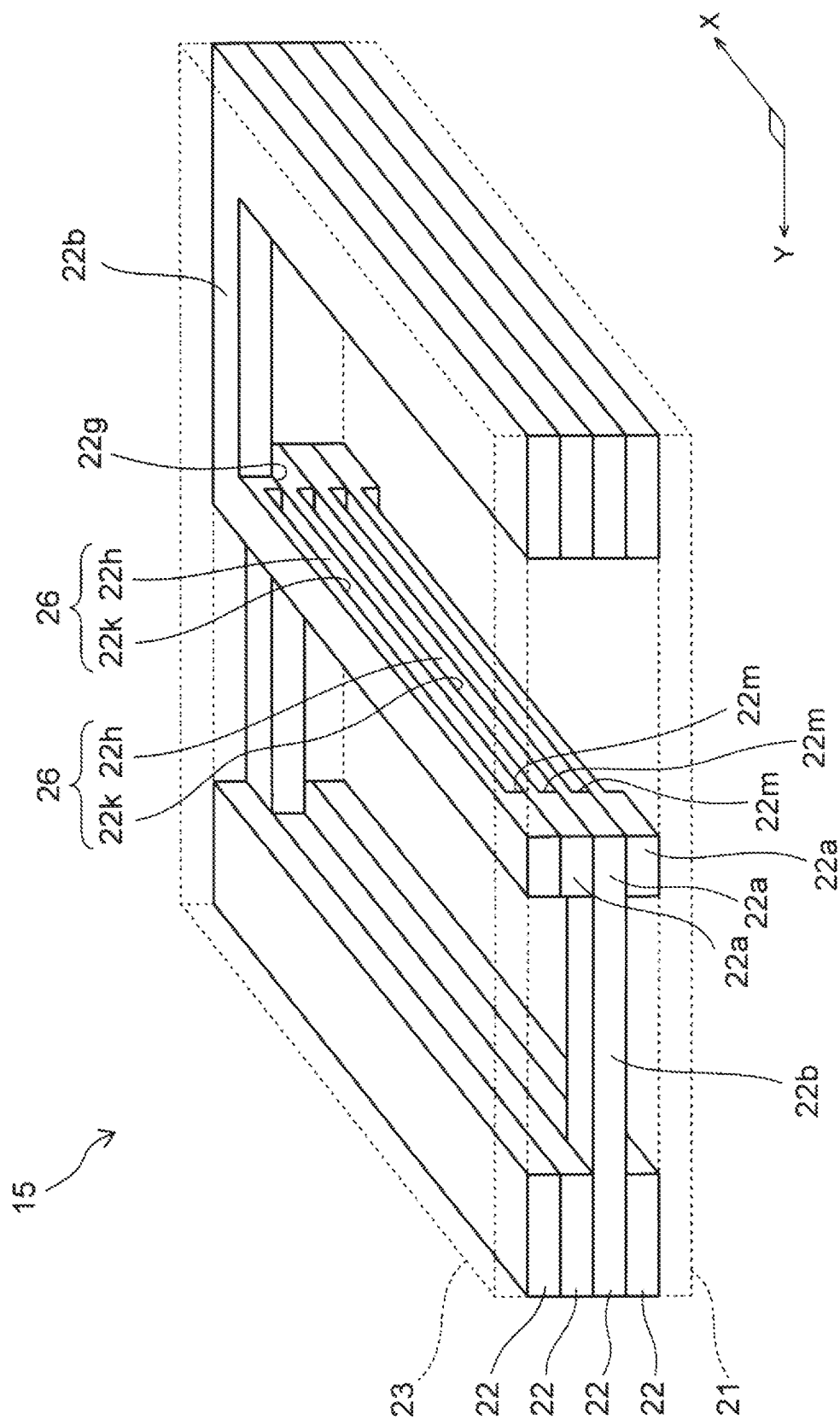
FIG. 21 is an exploded perspective view of a loop type heat pipe according to a third modification of the present embodiment.

FIG. 21 is an exploded perspective view of a vapor pipe 15 of a loop type heat pipe 11 according to a third modification.

In this example, a concave portion 22k is provided in each of support column portions 22a of intermediate metal layers 22. The concave portion 22k is formed by half-etching the intermediate metal layer 22 from a lower surface 22g side. A depth of the concave portion 22k is, for example, about 50 μm to about 100 μm.

A first opening portion 26 is formed by an upper surface 22h of a lower-side intermediate metal layer 22 and the concave portion 22k of an upper-side intermediate metal layer 22 in the two intermediate metal layers 22 adjacent to each other in an up/down direction.

Thus, the first opening portion 26 is opened more largely than that in the example of FIG. 11 in which the intermediate metal layers 22 are made porous. Accordingly, vapor Cv can more easily circulate through the first opening portion 26 so that pressure loss of the vapor Cv in the vapor pipe 15 can be reduced more easily.

In addition, the intermediate metal layer 22 present by the side of the concave portion 22k functions as a column 22m. In this example, the columns 22m of the intermediate metal layers 22 are connected to one another in the up/down direction. Thus, strength of the vapor pipe 15 is secured by the columns 22m.

Fourth Modification

Figure 22:
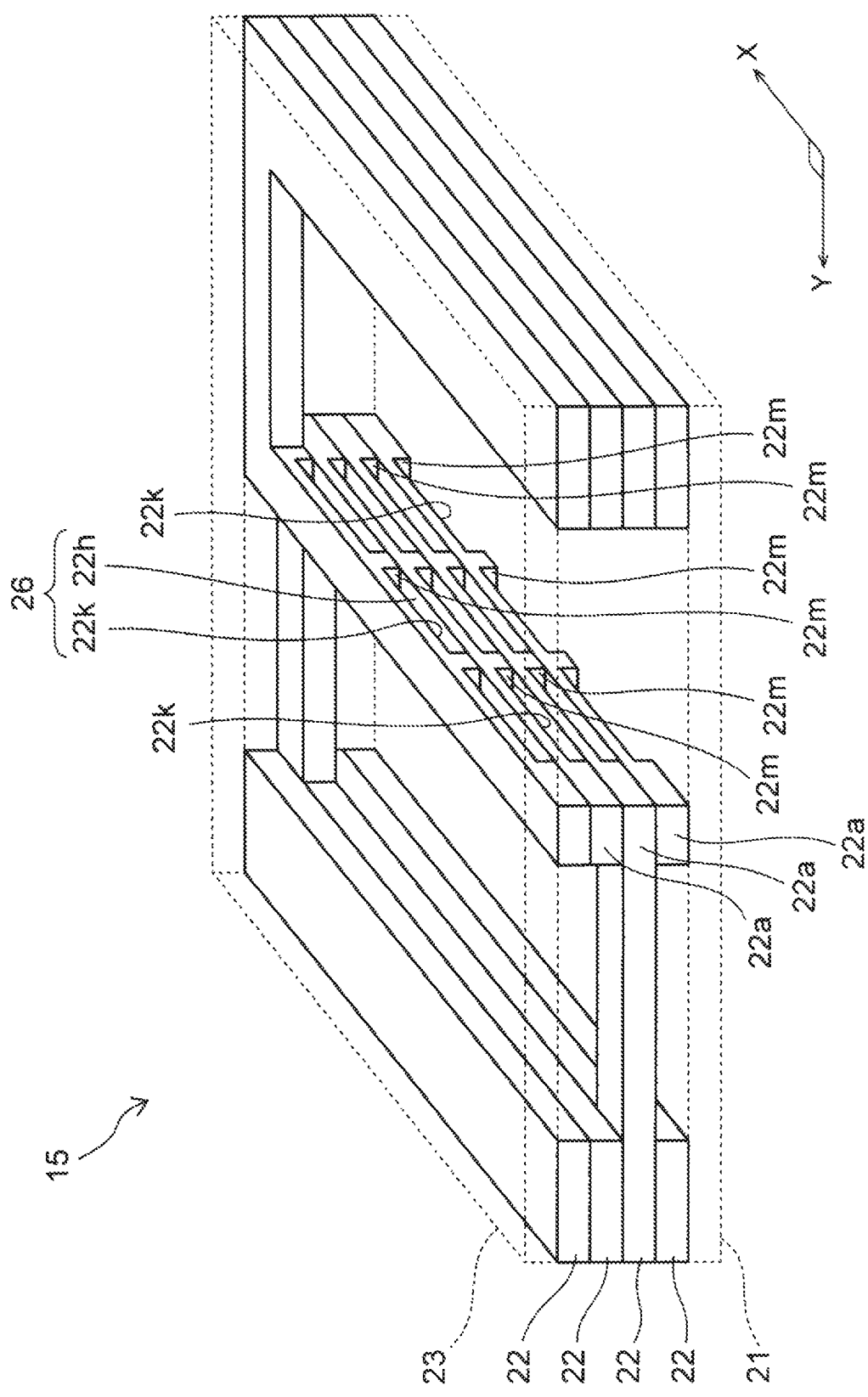
FIG. 22 is an exploded perspective view of a loop type heat pipe according to a fourth modification of the present embodiment.

FIG. 22 is an exploded perspective view of a vapor pipe 15 of a loop type heat pipe 11 according to a fourth modification.

In this modification, the number of concave portions 22k extending along an extension direction X of the vapor pipe 15 is set to be larger than that in the third modification. Thus, the number of columns 22 is larger than that in the third modification. Accordingly, the strength of the vapor pipe 15 can be enhanced by the columns 22m while pressure loss in the vapor pipe 15 is reduced by first opening portions 26.

Fifth Modification

Figure 23:
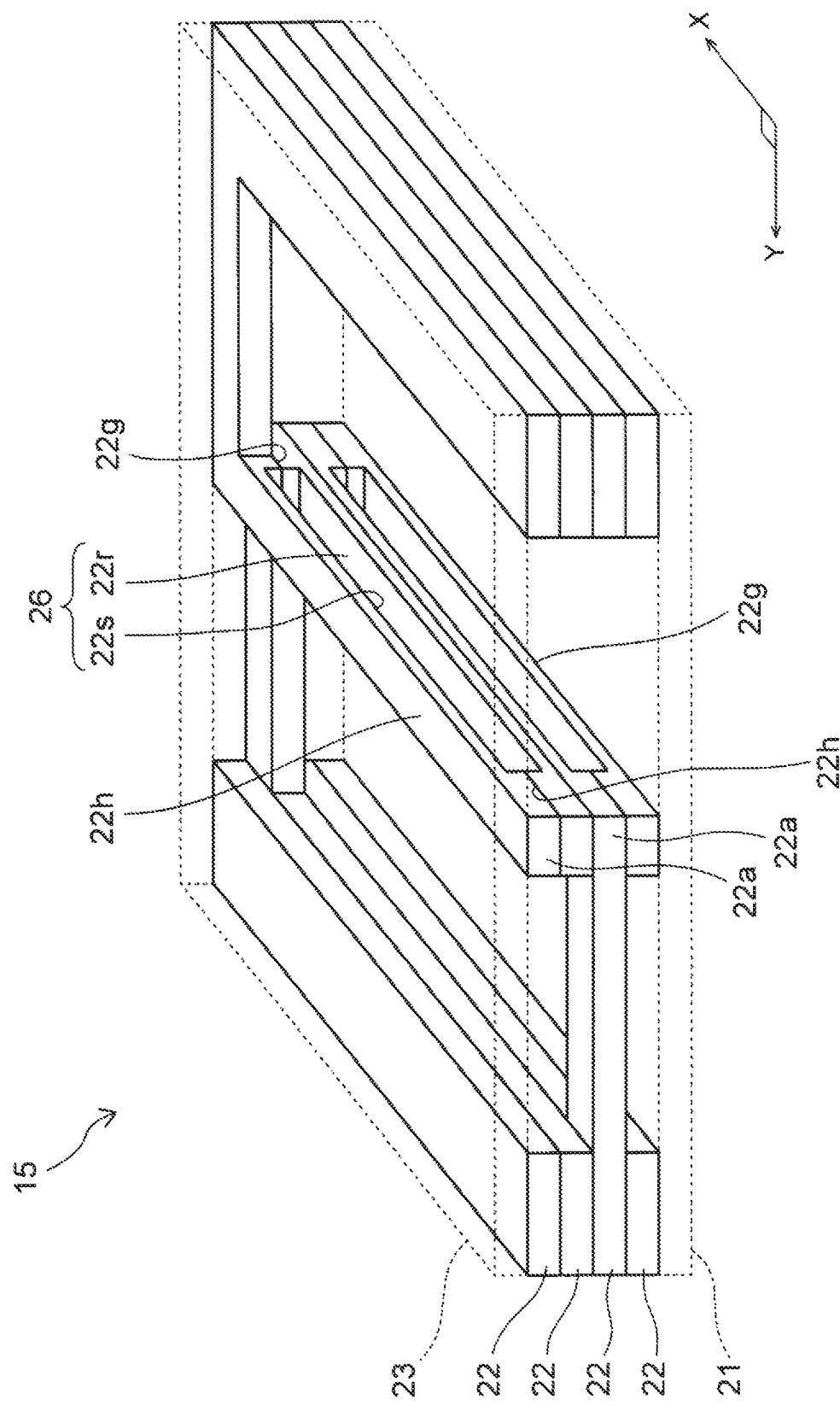
FIG. 23 is an exploded perspective view of a loop type heat pipe according to a fifth modification of the present embodiment.

FIG. 23 is an exploded perspective view of a vapor pipe 15 of a loop type heat pipe 11 according to a fifth modification.

In the present modification, a first concave portion 22r is formed in an upper surface 22h of a lower-side support column portion 22a, and a second concave portion 22s is formed in a lower surface of an upper-side support column portion 22a, of the two support column portions 22a adjacent to each other in an up/down direction. A first opening portion 26 is defined by the two concave portions 22r and 22s.

Incidentally, the support column portions 22a are half-etched so that each of the concave portions 22r and 22s is formed to have a depth of about 50 μm to about 100 μm.

When the first opening portion 26 is defined thus by the two concave portions 22r and 22s, the first opening portion 26 is configured to be opened more largely. Accordingly, vapor Cv can flow through the first opening portion 26 more easily so that pressure loss in the vapor pipe 15 can be further reduced in comparison with that in the third modification or the fourth modification.

In addition, no concave portion is formed in an upper surface 22h of a support column portion 22a of an uppermost intermediate metal layer 22. The upper surface 22h is shaped like a stripe extending along an extension direction X of the vapor pipe 15. The upper surface 22h is bonded to an upper-side metal layer 23. Thus, the upper-side metal layer 23 is reinforced so that the vapor pipe 15 can be effectively prevented from being crushed.

In a similar manner or the same manner, a lower surface 22g of a support column portion 22a of a lowermost intermediate metal layer 22 is also shaped like a stripe extending along the extension direction X. The lower surface 22g is bonded to a lower-side metal layer 21. Thus, the lower-side metal layer 21 is reinforced.

Further, a contact area between the upper-side metal layer 23 and the support column portion 22a of the uppermost intermediate metal layer 22 and a contact area between the lower-side metal layer 21 and the support column portion 22a of the lowermost intermediate metal layer 22 can be enlarged so that bonding strength can be enhanced. Accordingly, strength of the vapor pipe 15 can be also secured.

Moreover, due to the use of a connection portion 22b having a concave portion opposed to the upper-side metal layer 23 or the lower-side metal layer 21, a working fluid can be circulated also in the aforementioned structure even if liquid stagnation occurs.

Sixth Modification

Figure 24:
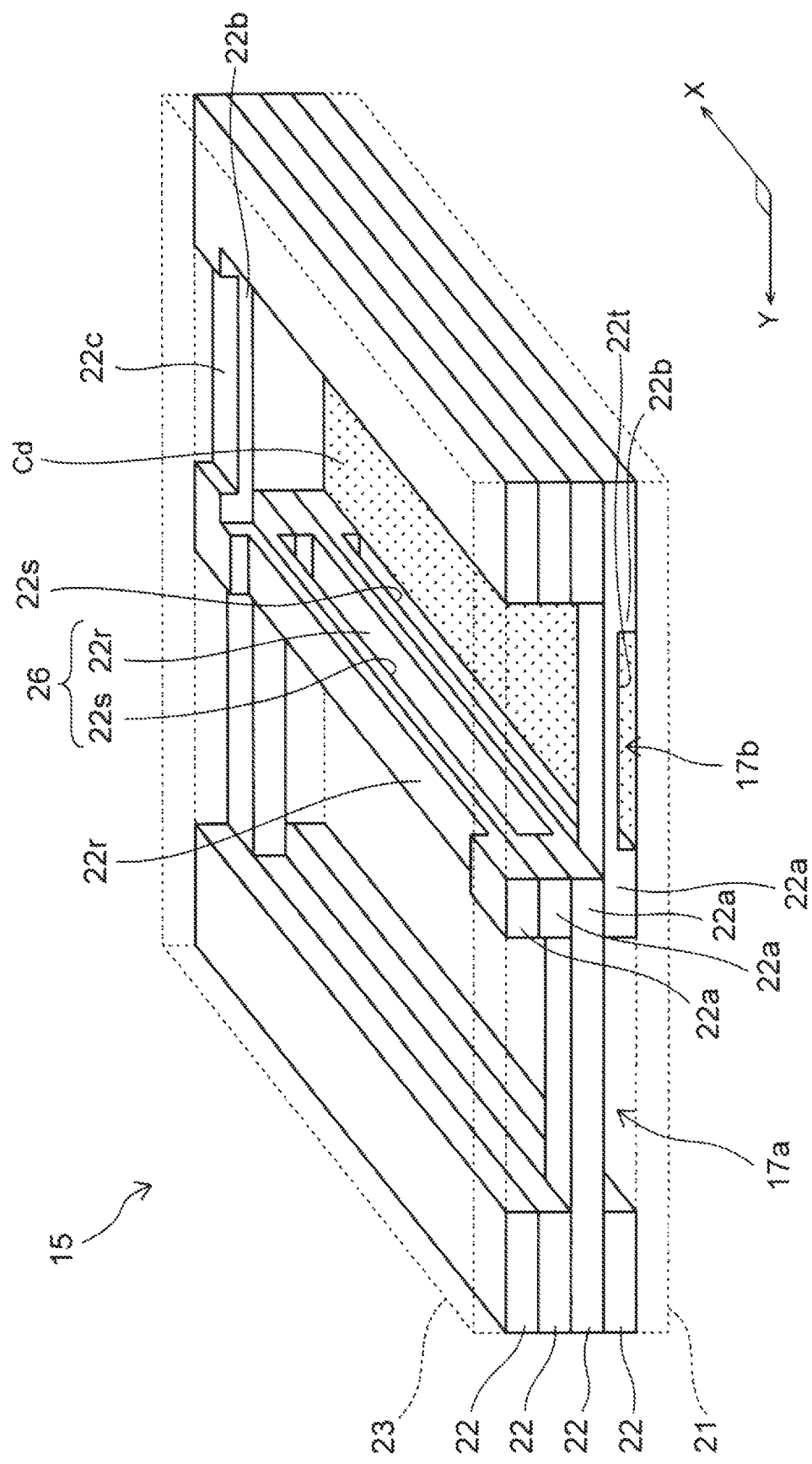
FIG. 24 is an exploded perspective view of a loop type heat pipe according to a sixth modification of the present embodiment.

FIG. 24 is an exploded perspective view of a vapor pipe 15 of a loop type heat pipe 11 according to a sixth modification.

Also in the present modification, a first opening portion 26 is defined by a first concave portion 22r and a second concave portion 22s in a similar manner to or the same manner as the fifth modification.

In the present modification, a second concave portion 22s of a lowermost intermediate metal layer 22 is provided to be opposed to a surface of a lower-side metal layer 21 so that a first flow path 17a and a second flow path 17b are connected to each other through the second concave portion 22s. Thus, even when a liquid-phase working fluid C is condensed into dew on the surface of the lower-side metal layer 21 due to a decline of outside air temperature, the working fluid C can circulate between the first flow path 17a and the second flow path 17b through the first concave portion 22s of the lowermost intermediate metal layer 22. Accordingly, liquid stagnation Cd of the working fluid C is hardly formed in the vapor pipe 15. As a result, a flow of vapor Cv in the vapor pipe 15 can be prevented from being hindered by the liquid stagnation Cd so that pressure loss in the vapor pipe 15 can be suppressed from increasing due to the liquid stagnation Cd.

In a similar manner or the same manner, a first concave portion 22r of an uppermost intermediate metal layer 22 may be provided to be opposed to a surface of an upper-side metal layer 23 so that the liquid-phase working fluid C condensed into dew on the surface of the upper-side metal layer 23 can be made to circulate through the first concave portion 22r. Thus, occurrence of the liquid stagnation Cd can be suppressed.

Further, a connection portion 22b of the lowermost intermediate metal layer 22 may be half-etched by a depth of about 50 μm to about 100 μm. Thus, a concave portion 22t opposed to the surface of the lower-side metal layer 21 can be formed in the connection portion 22b. Thus, the liquid-phase working fluid C can circulate through the concave portion 22t. Accordingly, formation of the liquid stagnation Cd of the working fluid C can be further effectively prevented.

For a similar reason or the same reason, a concave portion 22c may be formed in a connection portion 22b of the uppermost intermediate metal layer 22 so as to be opposed to the surface of the upper-side metal layer 23.

Seventh Modification

Figure 25:
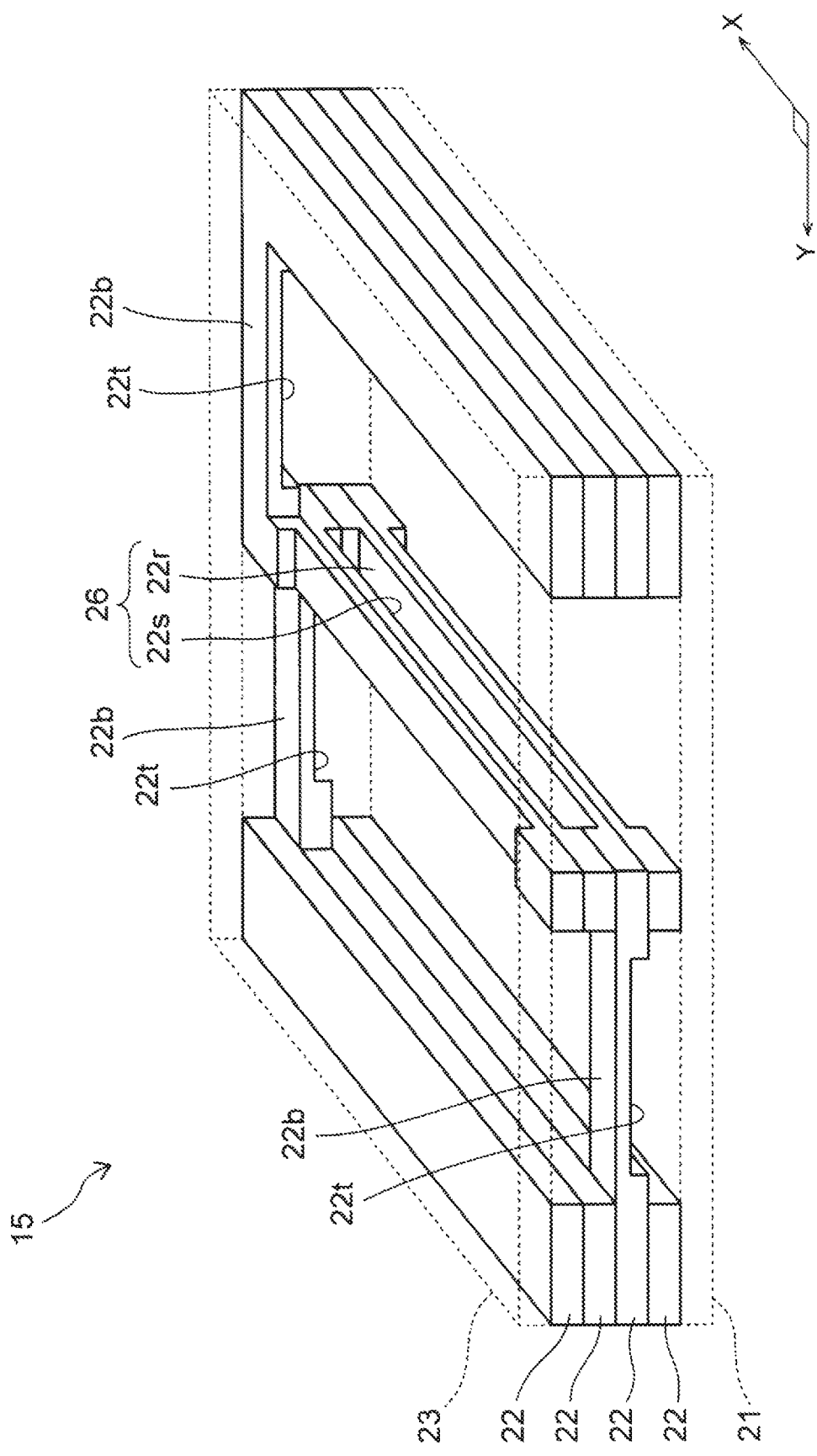
FIG. 25 is an exploded perspective view of a loop type heat pipe according to a seventh modification of the present embodiment.

FIG. 25 is an exploded perspective view of a vapor pipe 15 of a loop type heat pipe 11 according to a seventh modification.

In this example, not a connection portion 22b of a lowermost intermediate metal layer 22 or an uppermost intermediate metal layer 22 but a connection portion 22b of each of intermediate metal layers 22 is half-etched to form a concave portion 22t, and the concave portion 22t is opposed to a surface of a lower-side metal layer 21.

Thus, vapor Cv flowing through the vapor pipe 15 can also flow through the concave portion 22t. Accordingly, pressure loss in the vapor pipe 15 can be further reduced.

In addition, the concave portion 22t is opposed to the surface of the lower-side metal layer 21. Accordingly, even when dew condensation of vapor Cv occurs in the surface of the lower-side metal layer 21, a working fluid C that has been condensed on the surface of the lower-side metal layer 21 can circulate through the concave portion 22t. Accordingly, occurrence of liquid stagnation inside the vapor pipe 15 can be prevented in a similar manner to or the same manner as that in the sixth modification.

Incidentally, the concave portions 22t may be opposed to an upper-side metal layer 23. Thus, the working fluid C that has been condensed into dew on a surface of the upper-side metal layer 23 can be made to circulate through the concave portions 22t so that occurrence of liquid stagnation in the surface of the upper-side metal layer 23 can be prevented.

Eighth Modification

Figure 26:
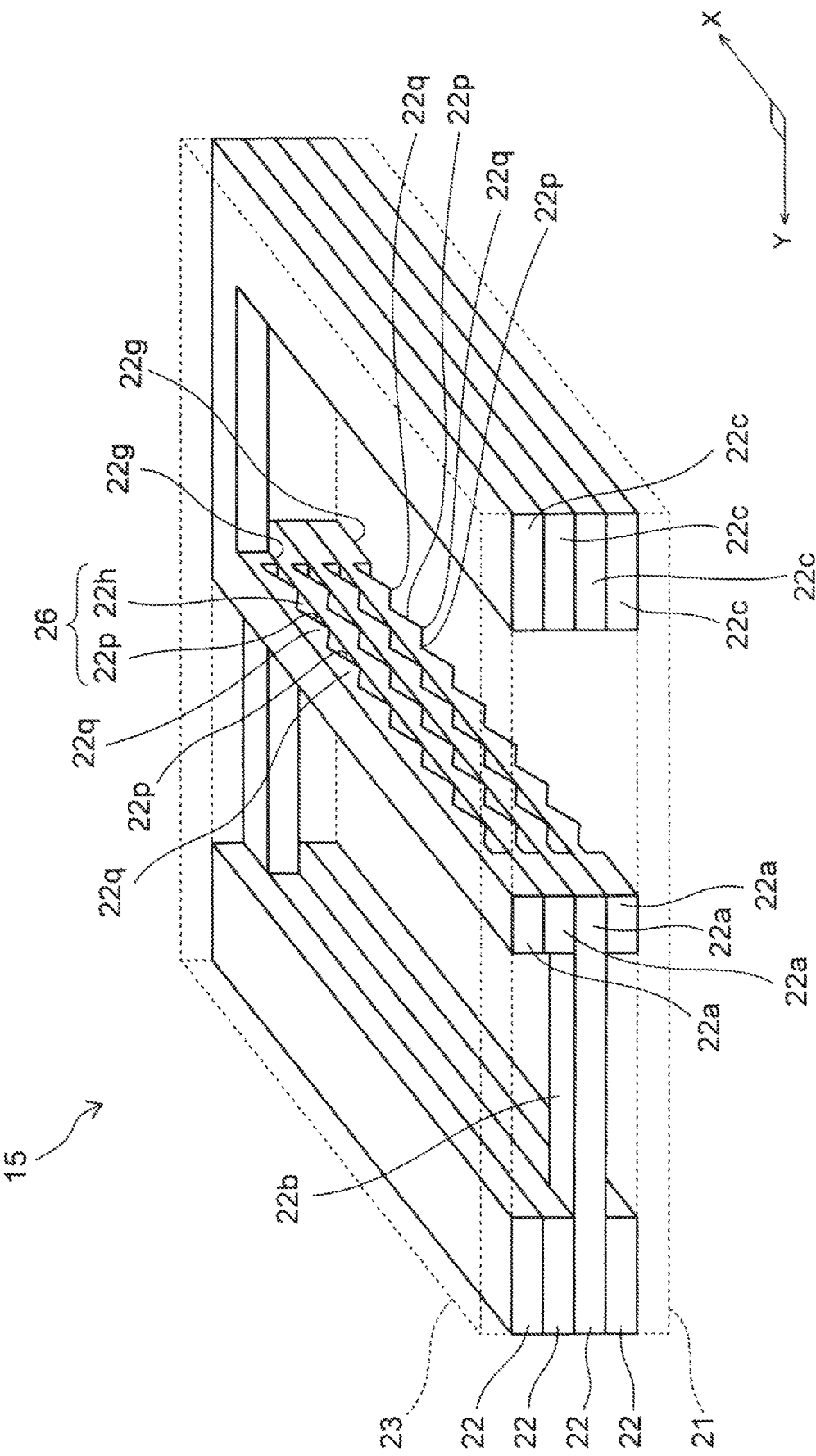
FIG. 26 is an exploded perspective view of a loop type heat pipe according to an eighth modification of the present embodiment.

FIG. 26 is an exploded perspective view of a vapor pipe 15 of a loop type heat pipe 11 according to an eighth modification.

In the present modification, as shown in FIG. 26, a lower surface 22g of each of support column portions 22a is half-etched. Thus, concave portions 22p and convex portions 22q continued alternately along an extension direction X of the vapor pipe 15 are formed in the lower surface 22g. Of them, each of the concave portions 22p has a depth of about 50 μm to about 100 μm so that first opening portions 26 can be defined by the concave portions 22p and an upper surface 22h of the support column portion 22a under the concave portions 22p.

In addition, the convex portions 22q are connected to the upper surface 22h under the convex portions 22q by metal-to-metal bonding. However, a contact area between each of the convex portions 22q and the upper surface 22h is small for sufficiently diffusing metal therebetween. Therefore, the convex portion 22q and the upper surface 22h are not metal-to-metal bonded to each other, or even if they are metal-to-metal bonded to each other, bonding strength between the both is weaker than bonding strength between pipe wall portions 22c adjacent to each other in an up/down direction.

Figure 27:
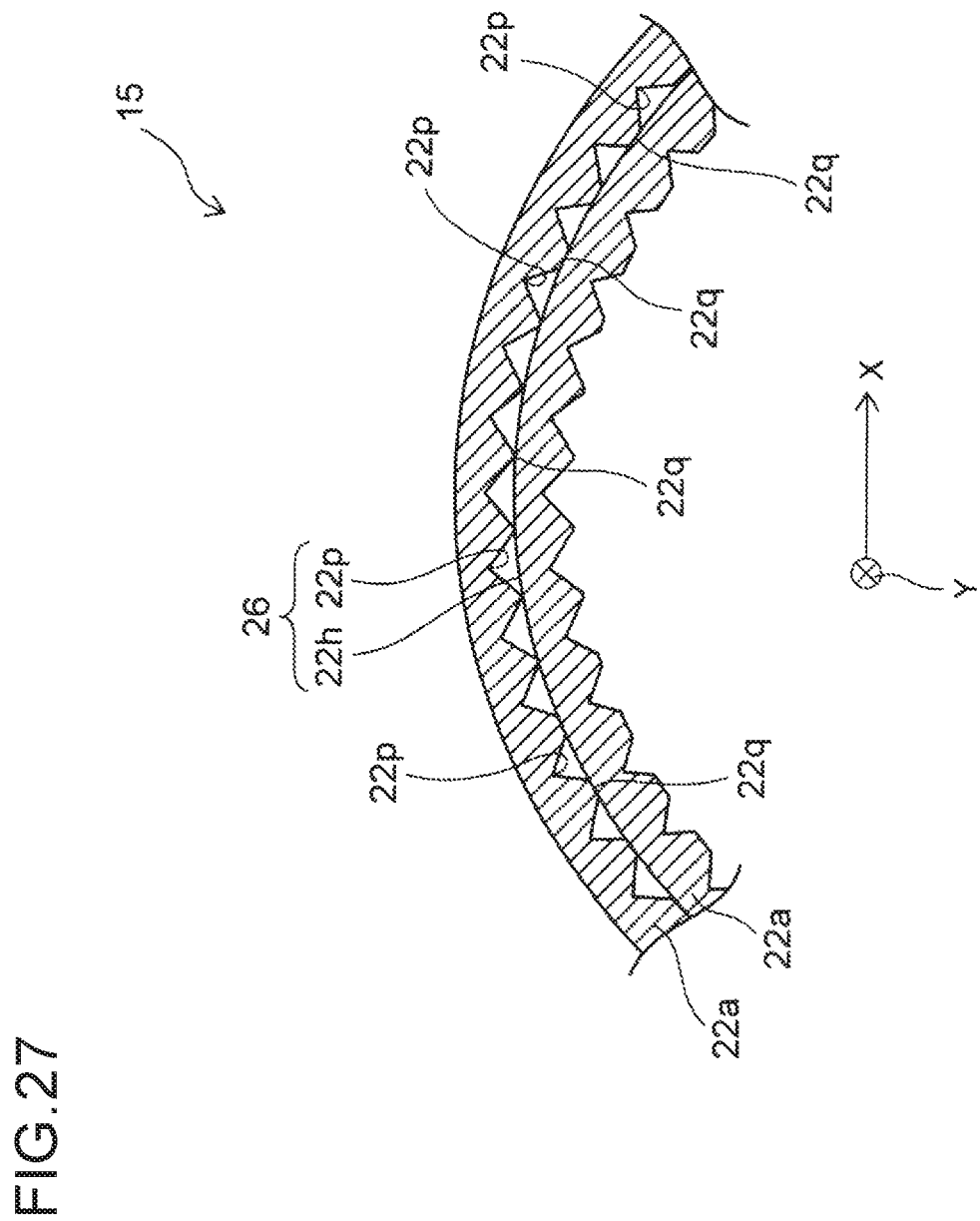
FIG. 27 is a sectional view for explaining an advantage in the loop type heat pipe according to the eighth modification of the present embodiment.

FIG. 27 is a sectional view for explaining an advantage obtained when the bonding strength between each of the convex portions 22q and the upper surface 22h is weakened thus. FIG. 27 is a sectional view of support column portions 22a extending along the extension direction X of the vapor pipe 15.

As shown in FIG. 27, the bonding strength between the convex portion 22q and the upper surface 22h is weakened in the aforementioned manner. Accordingly, the convex portion 22q can be moved on the upper surface 22h when the vapor pipe 15 is bent, and the convex portion 22q can be crushed at a part where stress is concentrated during the bending. Thus, the bending of the vapor pipe 15 is so easy that the vapor pipe 15 can be bent easily as in FIG. 19 or FIG. 20. Moreover, due to the convex portion 22q, the first opening portion 26 can be suppressed from being crushed during the bending. Accordingly, pressure loss in the vapor pipe 15 can be also reduced while an opening area of the first opening portion 26 is sufficiently maintained.

The shape of the concave portion 22p is not limited particularly.

Figure 28A:
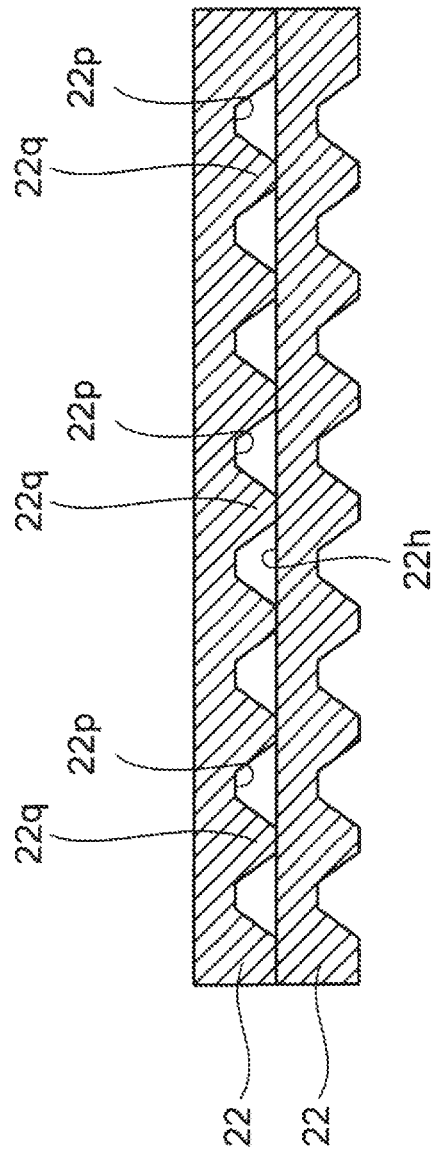
FIGS. 28A and 28B are sectional views showing various examples of a sectional shape of each concave portion in the eighth modification of the present embodiment.
Figure 28B:
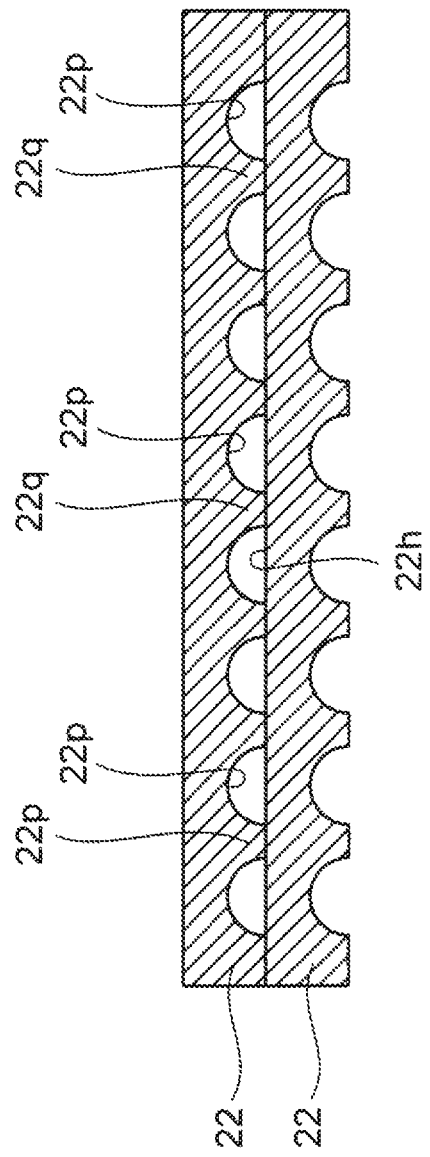

FIGS. 28A and 28B are sectional views showing various examples of the sectional shape of the concave portion 22p.

In the example of FIG. 28A, the concave portion 22p is shaped like a trapezoid in sectional view. In the example of FIG. 28B, the concave portion 22p is shaped like a hemisphere in sectional view.

Also in any of the examples of FIGS. 28A and 28B, bonding strength between the convex portion 22q and the upper surface 22h is so weak that the vapor pipe 15 can be bent easily.

As described above, the exemplary embodiment and the modification are described in detail. However, the present invention is not limited to the above-described embodiment and the modification, and various modifications and replacements are applied to the above-described embodiment and the modifications without departing from the scope of claims.

What is claimed is:

1. A loop type heat pipe comprising:
an evaporator that is configured to evaporate a working fluid;
a condenser that is configured to condense the evaporated working fluid;
a vapor pipe that is provided between the evaporator and the condenser, and through which the evaporated working fluid flows; and
a liquid pipe that is provided between the evaporator and the condenser, and through which the liquid-phase working fluid flows;
wherein the vapor pipe comprises:
a lower-side metal layer;
an intermediate metal layer that is disposed on the lower-side metal layer;
an upper-side metal layer that is disposed on the intermediate metal layer;
a pipe conduit that is formed by the lower-side metal layer, the intermediate metal layer and the upper-side metal layer; and
a support column that is provided inside the pipe conduit and is connected to the lower-side metal layer and the upper-side metal layer;
wherein the support column divides the pipe conduit into a first flow path and a second flow path, and
wherein a first opening defined in the support column communicates the first flow path with the second flow path.

2. The loop type heat pipe according to claim 1, wherein:
the intermediate metal layer has a connection portion that is a portion of the intermediate layer that is connected to the support column; and
a second opening defined in the connection portion extends along an extension direction of the pipe conduit.

3. The loop type heat pipe according to claim 1, wherein:
the support column comprises a plurality of support column portions that are stacked on one another;
each of the support column portions comprises: a lower surface formed with a first hole, and an upper surface that is opposite to the lower surface and formed with a second hole;
the first hole of a first support column portion of the support column portions communicates with the second hole of the first support column portion;
the first opening comprises a plurality of first opening portions; and
each of the first opening portions is formed by a corresponding one of the first holes and a corresponding one of the second holes.

4. The loop type heat pipe according to claim 3, wherein:
the first hole of the first support column portion partially overlaps with the second hole of a second support column portion adjacent to the first support column portion in plan view.

5. The loop type heat pipe according to claim 1, wherein:
the support column comprises a plurality of support column portions that are stacked on one another;
each of the support column portions comprises a lower surface formed with a concave portion, and an upper surface that is opposite to the lower surface; and
the first opening is formed by an upper surface of a first support column portion of the support column portions and the concave portion of a second support column portion adjacent to the first support column portion.

6. The loop type heat pipe according to claim 5, wherein:
the concave portions are formed in the lower surface of each of the support column portions so as to be disposed side by side in an extension direction of the pipe conduit.

7. The loop type heat pipe according to claim 1, wherein:
the support column comprises a plurality of support column portions that are stacked on one another;
a first support column portion of the support column portions comprises an upper surface formed with a first concave portion, and a lower surface that is opposite to the upper surface;
a second support column portion adjacent to the first support column portion comprises an upper surface, and a lower surface that is opposite to the upper surface and formed with a second concave portion; and
the first opening is formed by the first concave portion and the second concave portion.

8. The loop type heat pipe according to claim 7, wherein:
one of the support column portions contacting the lower-side metal layer comprises a lower surface formed with no concave portion; and
one of the support column portions contacting the upper-side metal layer comprises an upper surface formed with no concave portion.

9. The loop type heat pipe according to claim 1, wherein:
the support column comprises a plurality of support column portions that are stacked on one another;
one of the support column portions contacting the lower-side metal layer comprises an upper surface, and a lower surface that is opposite to the upper surface and formed with a concave portion; and
the first opening is formed by the concave portion and an upper surface of the lower-side metal layer.

10. A loop type heat pipe comprising:
an evaporator that is configured to evaporate a working fluid;
a condenser that is configured to condense the evaporated working fluid;
a vapor pipe that is provided between the evaporator and the condenser, and through which the evaporated working fluid flows; and
a liquid pipe that is provided between the evaporator and the condenser, and through which the liquid-phase working fluid flows;
wherein the vapor pipe comprises:
a lower-side metal layer;
an intermediate metal layer that is disposed on the lower-side metal layer;
an upper-side metal layer that is disposed on the intermediate metal layer;
a pipe conduit that is formed by the lower-side metal layer, the intermediate metal layer and the upper-side metal layer; and
a support column that is provided inside the pipe conduit and is connected to the lower-side metal layer and the upper-side metal layer,
wherein:
the support column divides the pipe conduit into a first flow path and a second flow path;
a first opening defined in the support column communicates the first flow path with the second flow path;
the intermediate metal layer comprises a plurality of intermediate metal layers;
the support column comprises a plurality of support column portions that are stacked on one another;
each of the support column portions comprises a lower surface where concave portions are formed along an extension direction of the pipe conduit, and an upper surface that is opposite to the lower surface;

the first opening comprises a plurality of first opening portions;

each of the first opening portions is formed by an upper surface of a first support column portion of the support column portions and a corresponding one of the concave portions of a second support column portion adjacent to the first support column portion; and bonding strength between the upper surface of the first support column portion and a lower surface of the second support column portion is smaller than bonding strength between adjacent ones of the intermediate metal layers.

* * * * *